United States Patent
Watanabe et al.

(10) Patent No.: US 7,919,415 B2
(45) Date of Patent: Apr. 5, 2011

(54) PROCESS OF MANUFACTURING A SEMICONDUCTOR DEVICE

(75) Inventors: Takayuki Watanabe, Yamanashi (JP); Tsutomu Michitsuta, Yamanashi (JP); Taro Hasegawa, Yamanashi (JP); Takuya Fujii, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 827 days.

(21) Appl. No.: 11/976,779

(22) Filed: Oct. 29, 2007

(65) Prior Publication Data
US 2008/0070419 A1   Mar. 20, 2008

Related U.S. Application Data

(62) Division of application No. 11/155,474, filed on Jun. 20, 2005, now Pat. No. 7,303,933, which is a division of application No. 10/073,877, filed on Feb. 14, 2002, now Pat. No. 6,924,162.

(30) Foreign Application Priority Data

Feb. 15, 2001   (JP) .................................. 2001-039252

(51) Int. Cl.
*H01L 21/302* (2006.01)
(52) U.S. Cl. .......... 438/750; 257/E21.214; 257/E21.221
(58) Field of Classification Search ............................ None
See application file for complete search history.

(56) References Cited

U.S. PATENT DOCUMENTS

| | | | |
|---|---|---|---|
| 4,719,633 A | 1/1988 | Yoshikawa et al. | 372/46 |
| 5,227,015 A | 7/1993 | Fujihara et al. | 156/647 |
| 5,236,864 A | 8/1993 | Iga et al. | 437/129 |
| 5,242,857 A | 9/1993 | Cooper et al. | 437/129 |
| 5,278,094 A | 1/1994 | Lievin et al. | 437/126 |
| 5,311,534 A | 5/1994 | Mori et al. | 372/46 |
| 5,441,912 A | 8/1995 | Tsukiji et al. | 437/129 |
| 5,452,315 A | 9/1995 | Kimura et al. | 372/46 |
| 5,568,501 A | 10/1996 | Otsuka et al. | 372/46 |
| 5,748,659 A | 5/1998 | Kimura et al. | 372/46 |
| 5,789,275 A | 8/1998 | Lee et al. | 438/40 |

(Continued)

FOREIGN PATENT DOCUMENTS

JP   3-054882   3/1992

(Continued)

OTHER PUBLICATIONS

Adachi et al. "Chemical Etching of InGaAsP/InP DH Wafer", Mar. 1982, Journal of the Electrochemical Society, vol. 129, pp. 1053-1062.

(Continued)

*Primary Examiner* — Allan Olsen
(74) *Attorney, Agent, or Firm* — Kratz, Quintos & Hanson, LLP

(57) ABSTRACT

A process of manufacturing a semiconductor device includes the steps of forming a stacked structure of a first III-V compound semiconductor layer containing In and having a composition different from InP and a second III-V compound semiconductor layer containing In. The second III-V compound semiconductor layer is formed over the first III-V compound semiconductor layer and growing an InP layer at regions adjacent the stacked structure to form a stepped structure of InP. The process further includes the step of wet-etching the stepped structure and the second III-V compound semiconductor layer using an etchant containing hydrochloric acid and acetic acid to remove at least the second III-V compound semiconductor layer.

6 Claims, 20 Drawing Sheets

U.S. PATENT DOCUMENTS

| | | | |
|---|---|---|---|
| 5,876,207 A | 3/1999 | Sundius et al. | 438/216 |
| 6,110,756 A | 8/2000 | Otsuka et al. | 438/41 |
| 2002/0119661 A1 | 8/2002 | Watanabe et al. | 438/691 |
| 2003/0012240 A1 | 1/2003 | Yamamoto et al. | 372/46 |

FOREIGN PATENT DOCUMENTS

| | | |
|---|---|---|
| JP | 2000-91303 | 3/2000 |

OTHER PUBLICATIONS

Fujii et al. (2000-091303 Translation), Mar. 2000.

PROCESS OF MANUFACTURING A SEMICONDUCTOR DEVICE

This application is a divisional application of U.S. Ser. No. 11/155,474, filed on Jun. 20, 2005, now U.S. Pat. No. 7,303,933 which application is a divisional application of U.S. Ser. No. 10/073,877, filed on Feb. 14, 2002, now U.S. Pat. No. 6,924,162 which application claims priority under 35 U.S.C. 119 of Japanese Application No. 2001-039252, filed on Feb. 15, 2001.

BACKGROUND OF THE INVENTION

1. Field of the Invention

The present invention generally relates to a compound semiconductor device and particularly relates to a process of manufacturing an optical semiconductor device used for optical communications and optical information processing.

A compound semiconductor has a band structure of a direct transition type that interacts with light and thus an optical semiconductor device utilizing compound semiconductor is widely used in the fields of optical communications and optical information processing. An InP material system's semiconductor device, particularly a laser diode, is important since it produces optical signals having a wavelength of 1.3 or 1.55 μm band which may be transmitted in an optical fiber.

2. Description of the Related Art

In order to improve laser oscillation efficiency for such a laser diode, it is necessary to provide a current blocking structure for confining injected carriers within a limited region along an axial direction. Further, since laser oscillation is produced by induced emission, light should also be efficiently confined within the region where the carriers are confined. For a laser diode of an InP material system, a horizontal light-confinement effect is achieved by adjusting a difference of refractive indices of the InGaAsP core for guiding the light and an InP buried layer.

FIGS. 1A to 1D are diagrams showing various steps of a manufacturing process of a laser diode 10 having a buried-hetero (BH) structure which serves as an electric current and light confinement structure.

Referring to FIG. 1A, a multi-quantum well layer 12 is formed over an n-type InP (n-InP) substrate 11. The multi-quantum well layer 12 includes repeatedly stacked InGaAsP layers. Further, a p-type InP (p-InP) cladding layer 13 and a p-type InGaAs (p-InGaAs) contact layer 14 are, in turn, formed on the multi-quantum well layer 12.

Then, in a step shown in FIG. 1B, a $SiO_2$ film 15 serving as an etching protection layer is formed on the contact layer 14. Then, dry etching is performed on such a structure to form active layer mesa-stripes. In the illustrated example, the mesa-stripes extend in the <011> direction.

In a step shown in FIG. 1C, a metal organic vapor phase epitaxy (MOVPE) is performed using the $SiO_2$ film 15 as a selective growth mask, such that crystals grow on both sides of the mesa strips to produce Fe-doped high-resistance InP buried layers 16A and 16B. During a regrowth step of such InP buried layers 16A and 16B, the (111) B surface develops which is a growth-stop surface. As a result, the buried layer builds up at the edge of the mask and gives a growth configuration that is raised as shown by reference numerals 16a and 16b.

Finally, in a step shown in FIG. 1D, the $SiO_2$ film 15 is removed, a p-side electrode 17 is formed on the contact layer 14 and an n-side electrode 18 is formed on a lower surface of the substrate 11.

As has been described above, when a buried growth process of the InP layers 16A and 16B is performed using the $SiO_2$ film 15 as a selective growth mask, the InP layers 16A and 16B inevitably rises at the regions 16a and 16b which correspond to the edges of the $SiO_2$ film 15. This is due to the fact that the crystals do not grow on the $SiO_2$ film 15 and thus the concentration of the material locally increases on the $SiO_2$ film 15. This causes an excessive supply of the material to the surface of the InP layer 16A or 16B grown on both sides of the mesa-region. For the step shown in FIG. 1C, when the height of the mesa-stripe is about 1.5 μm, the InP layers 16A, 16B will rise about 0.7 μm at the regions 16a, 16b at the edge of the mask.

As has been described above, in the step shown in FIG. 1D, the p-side electrode 17 is formed on such a stepped surface. When a Ti layer, a Pt layer and an Au layer are sputtered in turn to form the p-side electrode 17, the Ti layer and the Pt layer each has a thickness of only about 0.1 μm. Therefore, as shown in FIG. 2, a break or discontinuity of the electrode layer may occur at uneven parts 17a due to the stepped configuration of the underlying structure. Such a break of the electrode causes an uneven electric current flow and thus gives rise to electric degradation of the device.

SUMMARY OF THE INVENTION

Accordingly, it is a general object of the present invention to provide a novel and useful process of manufacturing a semiconductor device which can solve the problems described above.

It is another and more specific object of the present invention to provide a process of manufacturing a semiconductor device in which, after forming a stepped structure of InP in a region adjacent to a mesa structure including a III-V group compound semiconductor layer by a regrowth process of an InP layer using a selective growth mask, the stepped structure is planarized by a simple wet-etching process to provide a planarized surface substantially flush with the surface of the III-V compound semiconductor layer.

According to the present invention, a process of manufacturing a semiconductor device includes the steps of:

a) forming a stacked structure of a first III-V compound semiconductor layer containing In and having a composition different from InP and a second III-V compound semiconductor layer containing In, the second III-V compound semiconductor layer being formed over the first III-V compound semiconductor layer;

b) growing an InP layer at regions adjacent the stacked structure to form a stepped structure of InP; and c) wet-etching the stepped structure and the second III-V compound semiconductor layer using an etchant containing hydrochloric acid and acetic acid to remove at least the second III-V compound semiconductor layer.

For a selective growth process of forming an InP buried layer at positions adjacent to a mesa-structure including III-V compound semiconductor layer containing In and having a composition different from InP using a selective growth mask, an etching rate adjusting layer of III-V compound semiconductor is formed on the above-mentioned compound semiconductor layer and then a wet-etching process is performed on the InP buried layer and the etching rate adjusting layer using an etchant containing hydrochloric acid and acetic acid. Accordingly, with such a process of manufacturing a semiconductor device, the stepped parts produced during the selective growth step of the InP buried layer can be eliminated and a planarized surface can be obtained which is flush with the upper surface of the above-mentioned compound semiconductor layer.

DETAILED DESCRIPTION OF THE PREFERRED EMBODIMENTS

In the following, principles and embodiments of the present invention will be described with reference to the accompanying drawings.

Figure 3:
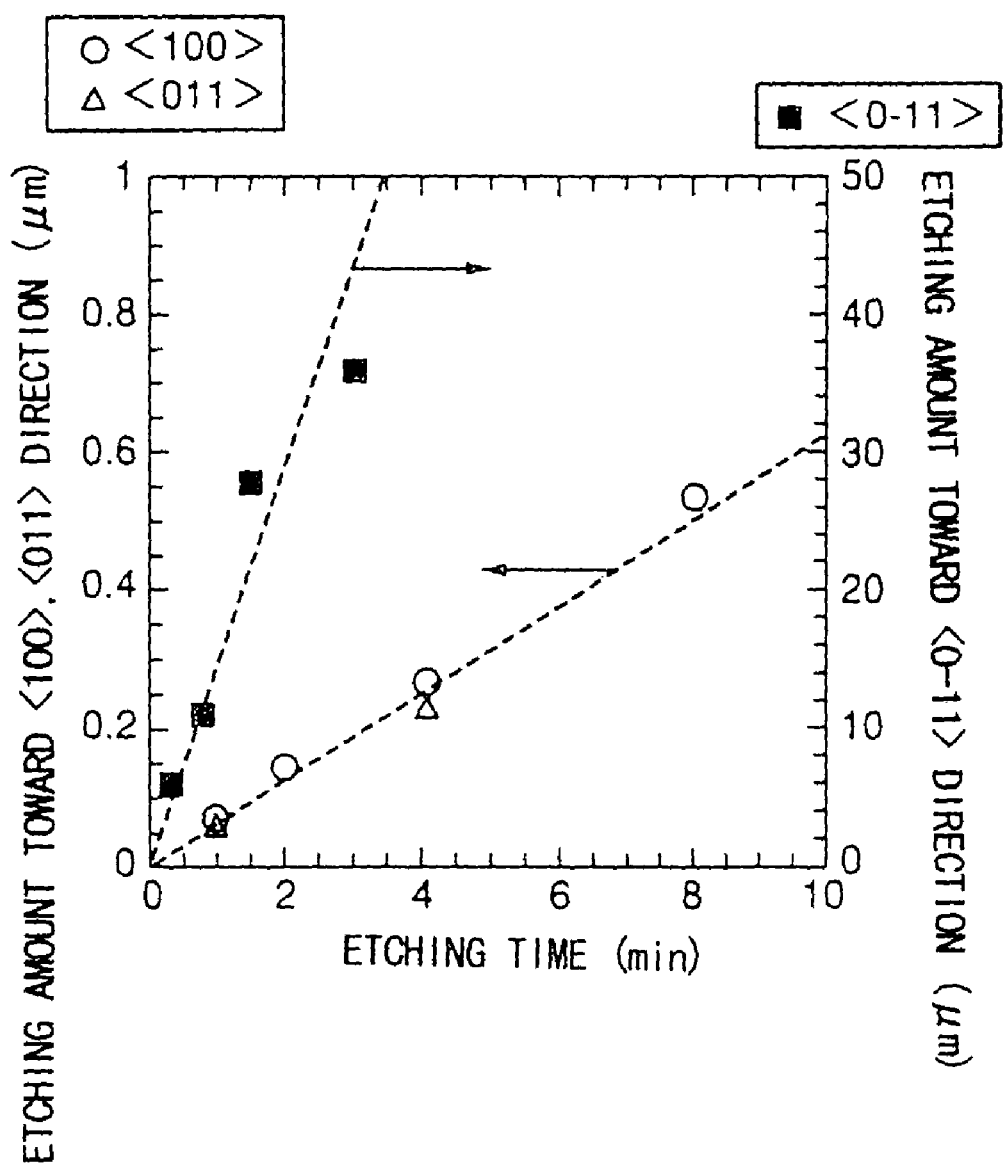
FIG. 3 is a graph for explaining the principle of the present invention.

Referring to FIGS. 3 to 6, principles of the present invention will be described. FIG. 3 is a graph showing an etching amount toward the <100>, <0-11> and <011> directions with respect to etching time for a basic experiment of the present invention in which an etching process is performed on a stepped InP layer using a mixture of hydrochloric acid, acetic acid and water mixed at a ratio of 1:5:1.

Referring to FIG. 3, it can be seen that the etching rates to the <100> and <011> directions are about 0.05 to 0.1 82 m/min, where as the etching rate to the <0-11> direction is about 15 μm/min, which is more than a hundred times greater than the etching rates to the <100> and <011> directions. Therefore, when the stepped configuration is etched using the above-mentioned mixture, the stepped part to the <0-11> direction recedes at a high rate. Accordingly, only the (100) and (011) surfaces and equivalent (0-1-1) surface remains as development surfaces and other surfaces will disappear. That is to say, it can be seen that by a wet-etching process using the above-mentioned etchant, only the (100), (011) or (0-1-1) surface will appear as a planarized surface on the InP layer.

When the ratio of the components in the etchant is altered, absolute etching rates will vary and relative etching rates with respect to each surface orientation will also vary.

Figure 4:
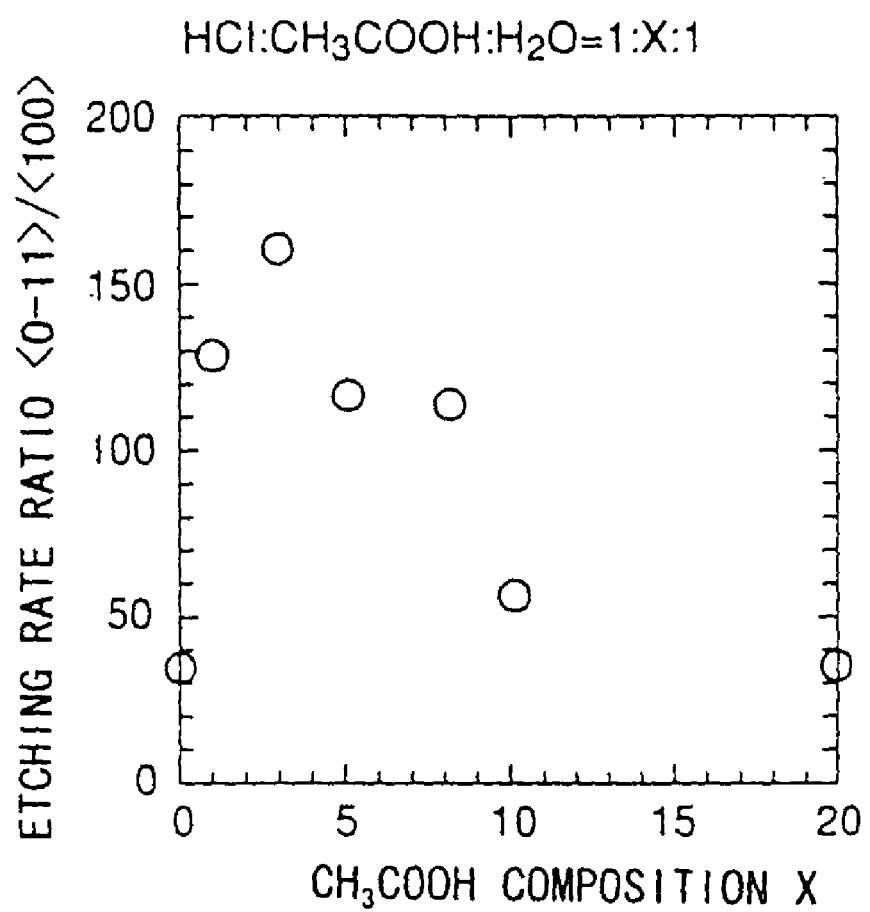
FIG. 4 is another graph for explaining the principle of the present invention.

FIG. 4 shows a graph of a ratio of the etching rate toward the <0-11> direction to the etching rate toward the <100> direction to against a ratio of concentration X of acetic acid to hydrochloric acid in the etchant. In FIG. 4, the ratio of concentration of hydrochloric acid: acetic acid: water of the above-mentioned etchant is expressed by 1:X:1.

Referring to FIG. 4, it can be seen that the etching rate to the <0-11> direction is 30 to 160 times greater than the etching rate to the <100> direction for any concentration within the entire range of the acetic acid concentration X. Such an anisotropy of etching is obtained by hydrochloric acid and acetic acid contained in the etchant. Notably, it can be seen that a ratio of etching rates which is greater than or equal to 30 is obtained when the ratio of concentration of acetic acid to hydrochloric acid to X is in the range between 1 and 20. Accordingly, when the concentration of acetic acid in the etchant is chosen to be in the above-mentioned range, an object of the present invention to obtain a remarkable planarizing effect of the InP layer is achieved.

When the concentration ratio of the water in the above-mentioned etchant changes, the concentration of (hydrochloric acid+acetic acid) will change. Therefore, the absolute value of the etching rate will change, but anisotropy of etching shown in FIGS. 3 and 4 will not change and therefore does not affect the planarizing effect.

Anisotropy of etching provided by the etchant of the present invention can also be obtained by adding hydrogen peroxide solution to the above-mentioned etchant mixture.

Figure 5:
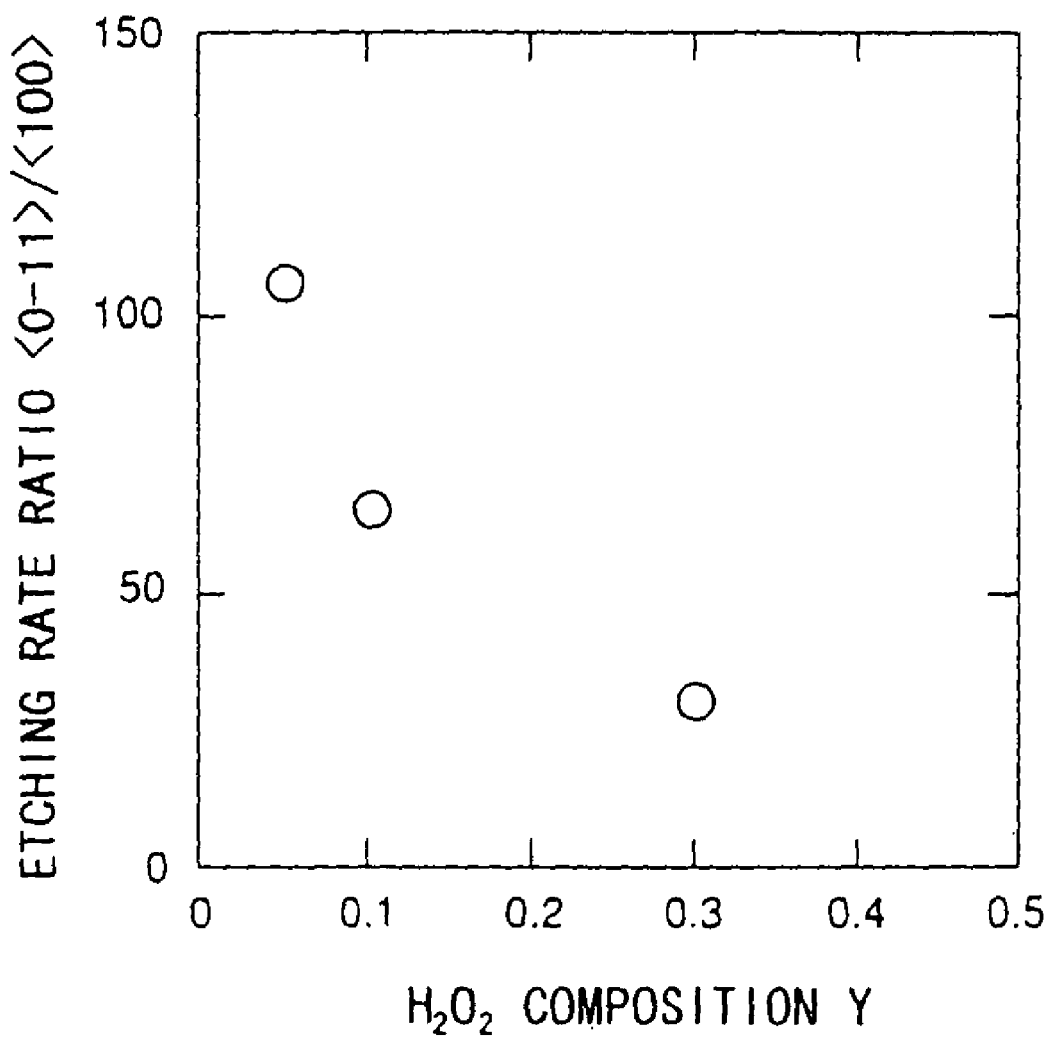
FIG. 5 is still another graph for explaining the principle of the present invention.

FIG. 5 is graph showing a ratio of etching rate toward the <0-11> direction to etching rate toward the <100> direction when a stepped configuration of InP is etched by an etchant obtained by adding hydrogen peroxide solution to the above-mentioned mixture containing hydrochloric acid, acetic acid and water.

Referring to FIG. 5, it can be seen that, when the composition ratio of hydrochloric acid, acetic acid, hydrogen peroxide solution and water in the above-mentioned etchant is expressed by 1:1:Y:1, an anisotropy of a value greater than or equal to 30 is obtained when the value of concentration Y of hydrogen peroxide solution is in a range between 0 to 0.3.

Figure 6:
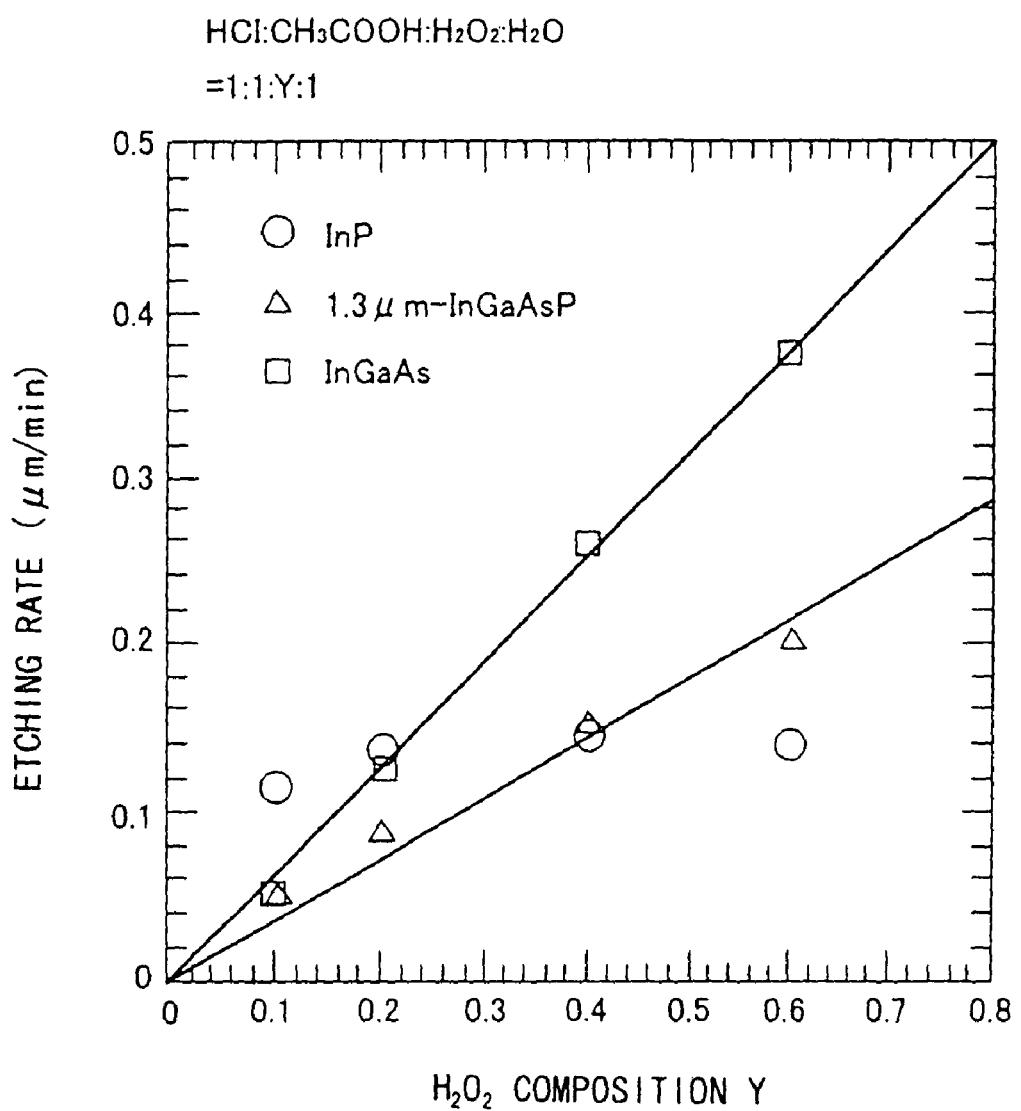
FIG. 6 is yet another graph for explaining the principle of the present invention.

FIG. 6 is a graph showing an etching rate toward the <100> direction when the InP layer, an InGaAs layer and an InGaAsP layer having a composition giving a bandgap wavelength of 1.3 μm are wet-etched by an etchant containing hydrochloric acid, acetic acid, hydrogen peroxide solution and water.

Referring to FIG. 6, it can be seen that the etching rate varies for each compound semiconductor layer depending of the composition of the etchant, particularly the concentration Y of hydrogen peroxide solution. It can be seen that the etching rate of the InP layer is not significantly changed by the concentration of the hydrogen peroxide solution in the above-mentioned etchant. However, there are significant changes in the etching rates of the InGaAs layer and the InGaAsP layer, and thus it can be seen that the etching rates for those III-V group layers significantly increase due to an increase of the concentration of hydrogen peroxide solution. For example, when the concentration of hydrogen peroxide solution Y in the etchant is less than 0.4 (Y<0.4), the etching rate of the InP layer is greater than the etching rate of the InGaAsP layer. When the concentration of hydrogen peroxide solution Y in the etchant is greater than 0.4 (Y>0.4), the relationship becomes opposite and the etching rate of the InGaAsP layer becomes greater than the etching rate of the InP layer. When the concentration of hydrogen peroxide solution Y in the etchant is set at a value equal to 0.4, the etching rate of the InGaAsP layer can be substantially matched with the etching rate of the InP layer.

Similarly, when the concentration of hydrogen peroxide solution Y in the etchant is less than 0.2 (Y<0.2), the etching rate of the InP layer is greater than the etching rate of the InGaAs layer and when the concentration of hydrogen peroxide solution Y in the etchant is greater than 0.2 (Y>0.2), the etching rate of the InGaAs layer is greater than the etching rate of the InP layer. Also, when the concentration of hydrogen peroxide solution Y in the etchant is set at a value equal to 0.2, the etching rate of the InGaAs layer can be substantially matched with the etching rate of the InP layer.

The principle of the process of manufacturing the semiconductor device of the present invention will be described by categorizing the principle into four basic types.

A. Type I

FIGS. 7A to 7D are diagrams showing a first type of the principle of the process of manufacturing the semiconductor device of the present invention based on the relationships shown in FIGS. 3 to 6. In FIGS. 7A to 7D, elements which have been described above are denoted by similar reference numerals and will not be described in detail.

Figure 1A:
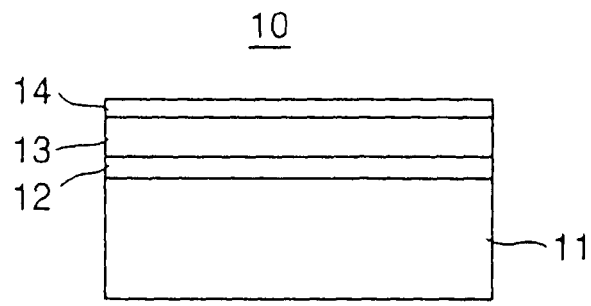
FIGS. 1A to 1D are diagrams showing various steps of a manufacturing process of a laser diode having a buried hetero structure of the related art.
Figure 1B:
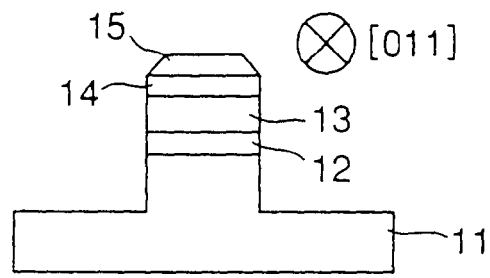
Figure 1C:
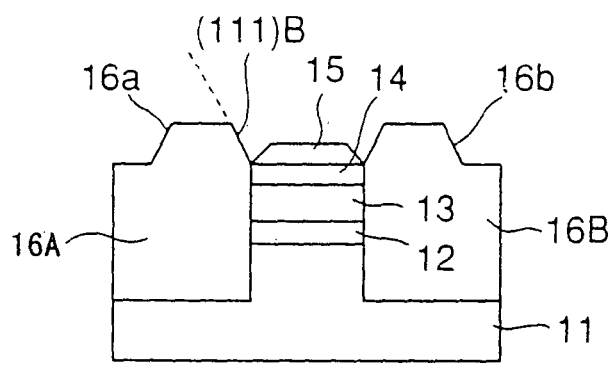
Figure 1D:
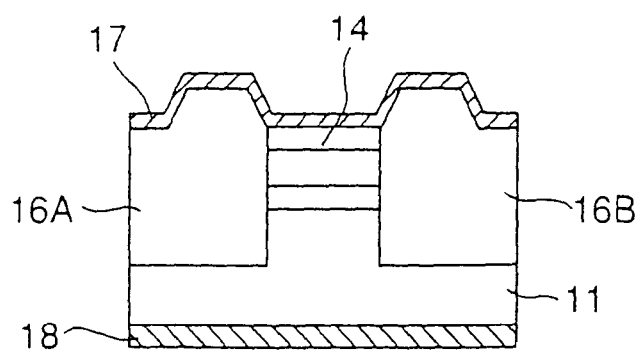
Figure 7A:
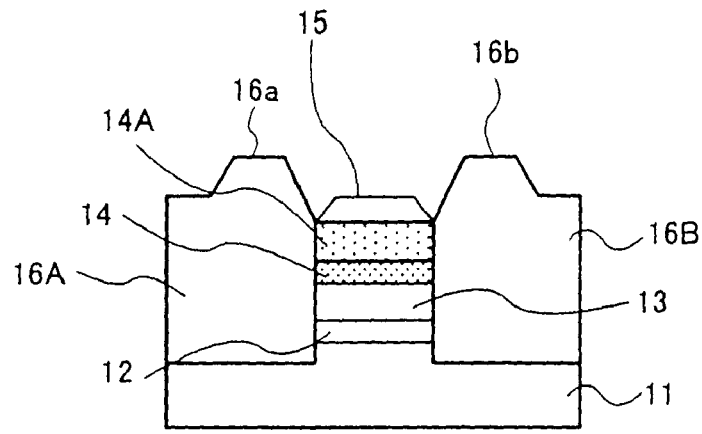
FIGS. 7A to 7D are diagrams showing various steps of a first basic type of the process of manufacturing the semiconductor device of the present invention.

Referring to FIG. 7A, in a manner similar to the structure shown in FIG. 1C, a mesa-stripe structure is formed on the n-type InP substrate 11 by a dry-etching process using a mask which is an insulating film pattern of a material such as $SiO_2$ or SiN. The mesa-stripe structure includes the active layer 12 having a multi-quantum well structure in which an InGaAsP quantum well layer and an InGaAsP barrier layer are alternately stacked, the p-type InP cladding layer 13 and the p-type InGaAs contact layer 14. However, the structure of FIG. 7A differs from the structure of FIG. 1C in that a sacrificial layer or an etching rate adjusting layer 14A is inserted between the contact layer 14 and the insulating film pattern 15. Fe-doped InP high-resistance buried layers 16A and 16B are formed on both sides of the mesa-stripe structure by a selective growth process using the insulating film pattern 15 as a mask. The InP buried layers 16A and 16B are provided with stepped configurations 16a and 16b, similar to those shown in FIG. 1C, which are characteristic features of the selective growth process using an insulating film as a mask.

Figure 7B:
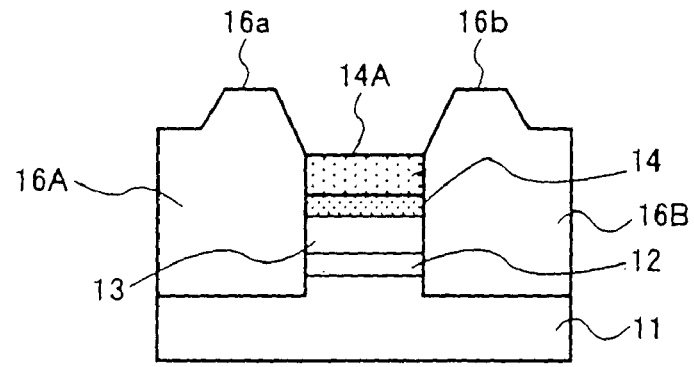

Then, in a step shown in FIG. 7B, the insulating film pattern 15 is removed. In a step shown in FIG. 7C, the structure shown in FIG. 7B is wet-etched using an etchant containing hydrochloric acid, acetic acid and hydrogen peroxide solution. Then, as has been described with reference to FIG. 3, the inclined surfaces toward the <0-11> direction of the InP buried layers 16A and 16B are preferentially etched. As a result, planarized surfaces 16c and 16d formed of the (100), (011) or (0-1-1) surface develop on the InP layers 16A and 16B. As can be seen from FIGS. 4 and 5, the planarizing operation of the stepped surfaces by anisotropic etching of the InP layer is most prominent when the mixture ratio of hydrochloric acid, acetic acid and hydrogen peroxide solution in the etchant is selected in a range between 1:1:0 and 10:10:3. In other words, for the composition in the above-mentioned range of composition, the etchant shows anisotropy of a value greater than or equal to 30.

Figure 7C:
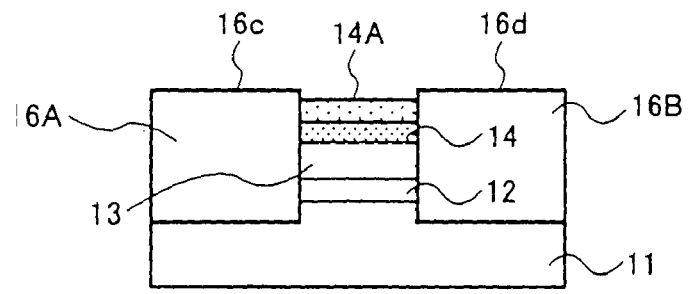

In the wet-etching step shown in FIG. 7C, the InGaAs etching rate adjusting layer 14A is also etched, so that the (100), (011) or (0-1-1) surface is developed in the same manner as the above-mentioned InP buried layers 16A and 16B. When an etchant for planarizing the InP layers 16A and 16B contains hydrochloric acid, acetic acid and hydrogen peroxide solution and has a composition with concentration of hydrogen peroxide solution Y being greater than 0.2 (Y>0.2), it can be seen from FIG. 6 that the etching rate of the planarizing surfaces 16c, 16d becomes smaller than the etching rate of the InGaAs etching rate adjusting layer 14A. As a result, the InGaAs etching rate adjusting layer 14A forms a recessed part that is recessed with respect to the InP buried layers 16A and 16B.

Figure 7D:
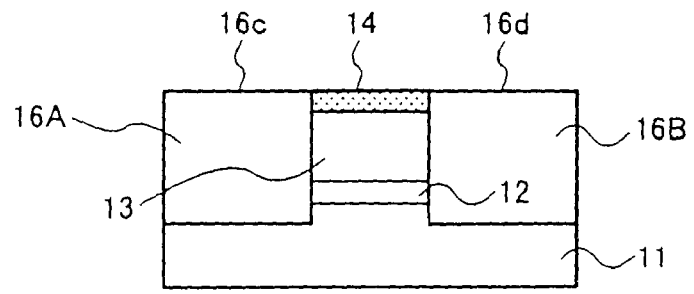

In the present invention, in the step shown in FIG. 7D, a further wet-etching process on the structure of FIG. 7C using a different etchant containing hydrochloric acid, acetic acid and hydrogen peroxide solution and having a composition with concentration of hydrogen peroxide solution Y being less than 0.2 (Y<0.2). Accordingly, the InP planarized surfaces 16c and 16d are etched at an etching rate greater than the etching rate of the etching rate adjusting layer 14A. Such wet-etching is continued until the etching rate adjusting layer 14A is etched and removed, so as to obtain a planarized structure in which the planarized surfaces 16c and 16d are flush with the surface of the InGaAs contact layer 14.

In the processes shown in FIGS. 7A to 7D, the same principle applies for a case where an InGaAsP layer having a bandgap composition of 1.3 μm shown in FIG. 6 is used as the etching rate adjusting layer 14A. It can be seen that the concentration of hydrogen peroxide solution Y of the etchant used in the process of FIG. 7C should be selected as being greater than 0.4 (Y>0.4) and the concentration of hydrogen peroxide solution Y of the etchant used in the process of FIG. 7D should be selected as being less than 0.4 (Y<0.4).

Also, in the process shown in FIG. 7D, in order to achieve a structure in which the surface of the contact layer 14 is flush with the planarized surfaces 16c and 16d of the InP buried layers 16A and 16B, the durations of the wet-etching processes of FIGS. 7C and 7D must be appropriately selected based on the etching rates of the etchants used in the respective wet-etching processes.

In detail, assuming that the stepped parts 16a, 16b shown in FIG. 7B have great anisotropy of etching and thus immediately planarized when the wet-etching process of FIG. 7C is started, a stepped part $L_{step}$ formed between the surface of the etching rate adjusting layer 14A and the planarized surface 16c or 16d in the process shown in FIG. 7C can be given by an equation:

$$L_{step} = (V_2 - V_1) \times t_1,$$

where $V_1$ is the etching rate of the InP layer 16A or 16B in the process shown in FIG. 7C;

$V_2$ is the etching rate of the etching rate adjusting layer 14A in the process shown in FIG. 7C; and $t_1$ is an etching time in the process shown in FIG. 7C.

It is noted that the stepped part $L_{step}$ should disappear as a result of the wet-etching process shown in FIG. 7D. Thus, the following relationship must hold, which can be shown by an expression:

$$L_{step}=(V_2-V_1)\times t_1=(V_3-V_4)\times t_2,$$

where, $V_3$ is the etching rate of the InP layer 16A or 16B in the wet-etching process shown in FIG. 7D;

$V_4$ is the etching rate of the etching rate adjusting layer 14A in the wet-etching process shown in FIG. 7D; and $t_2$ is an etching time in the process shown in FIG. 7D.

Now, it is approximated from the relationship shown in FIG. 6 that the etching rate $V_3$ of the InP buried layer 16A, 16B in the process shown in FIG. 7D is approximately equal to the etching rate $V_1$ of the InP buried layer 16A, 16B in the process shown in FIG. 7C ($V_1 \approx V_3$). Then, the above-mentioned relationship can be rewritten as:

$$(V_2-V_1)\times t_1=(V_1-V_4)\times t_2.$$

To completely remove the etching rate adjusting layer 14A in the process shown in FIG. 7D, assuming that the relationship $V_1 \approx V_3$ holds, the thickness of the etching rate adjusting layer 14A may be selected at a value defined by an equation $V_1 \times (t_1+t_2)$.

B. Type II

FIGS. 8A to 8D are diagrams showing a second type of the principle of the process of manufacturing the semiconductor device of the present invention for a case where the etching rate of planarizing the InP buried layers 16A and 16B is greater than the etching rate of the etching rate adjusting layer 14A. In FIGS. 8A to 8D, elements which have been described above are denoted by similar reference numerals and will not be described in detail.

Figure 8A:
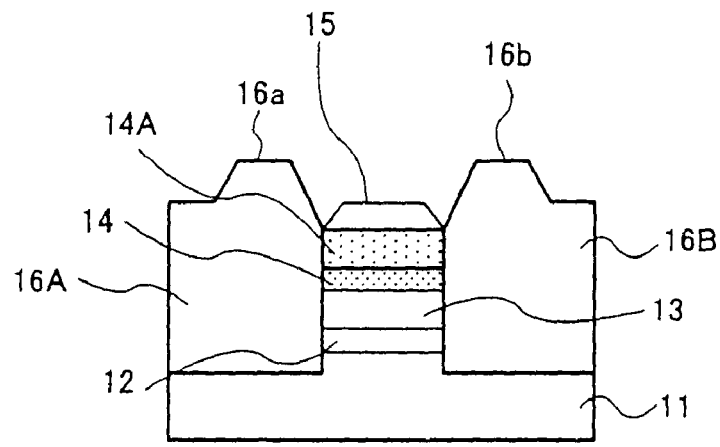
FIGS. 8A to 8D are diagrams showing various steps of a second basic type of the process of manufacturing the semiconductor device of the present invention.
Figure 8B:
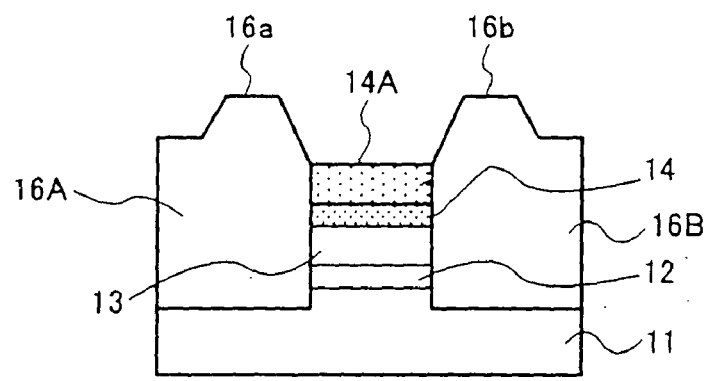

Referring to FIGS. 8A to 8D, the processes of FIGS. 8A and 8B are the same as the processes shown in FIGS. 7A and 7B. That is to say, an InGaAs or InGaAsP etching rate adjusting layer 14A is formed on a p-type InGaAs contact layer 14, a mesa-stripe structure is formed on the InP substrate 11 using an insulating film pattern 15 as a mask, high-resistance InP buried layers 16A and 16B are formed on both sides of the mesa-stripe structure using the same insulating film pattern 15 as a selective-growth mask and the insulating film pattern 15 is removed.

Figure 8C:
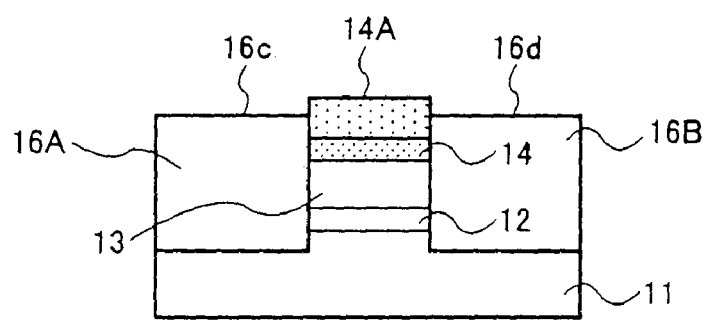

In the process shown in FIG. 8C, a wet etching process is performed on the structure of FIG. 8B using an etchant containing hydrochloric acid, acetic acid and hydrogen peroxide solution and having a composition with the concentration of hydrogen peroxide solution being such that the etching rate of the InP buried layers 16A, 16B is greater than the etching rate of the etching rate adjusting layer 14A. Thus, the stepped parts 16a and 16b of the InP buried layers 16A and 16B are etched and produce the planarized surfaces 16c and 16d. As a result of such wet-etching process, the etching rate adjusting layer 14A protrudes upwardly from the planarized surfaces 16c and 16d and thus forms a protruded structure.

Figure 8D:
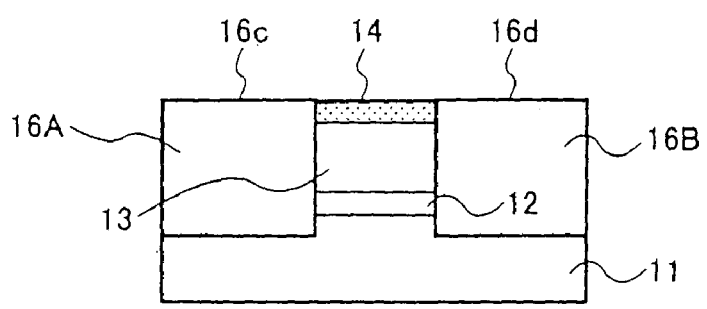

Thus, the process shown in FIG. 8C is followed by the process shown in FIG. 8D. The etching rate adjusting layer 14A and the InP planarized surfaces 16c, 16d are etched using an etchant containing hydrochloric acid, acetic acid and hydrogen peroxide solution and having a composition with the concentration of hydrogen peroxide solution being such that the etching rate of the etching rate adjusting layer is greater than the etching rate of InP.

For the processes shown in FIGS. 8A to 8D, when the etching rate adjusting layer 14A is of InGaAs, in accordance with the relationship shown in FIG. 6, the concentration of hydrogen peroxide solution Y may be selected at a value less than 0.2 (Y<0.2) for the process shown in FIG. 8C and at a value greater than 0.2 (Y>0.2) for the process shown in FIG. 8D. When the etching rate adjusting layer 14A is of InGaAsP layer which has a composition corresponding to a bandgap wavelength of a 1.3 μm, the concentration of hydrogen peroxide solution Y may be selected at a value less than 0.4 (Y<0.4) for the process shown in FIG. 8C and at a value greater than 0.4 (Y>0.4) for the process shown in FIG. 8D.

Also, in the process shown in FIG. 8D, in order to achieve a structure in which the surface of the contact layer 14 is flush with the planarized surfaces 16c and 16d of the InP buried layers 16A and 16B, the durations of the wet-etching processes of FIGS. 8C and 8D must be appropriately selected based on the etching rates of the etchants used in the respective wet-etching processes.

In detail, a stepped part $L_{step}$ formed between the surface of the etching rate adjusting layer 14A and the planarized surface 16c or 16d in the step shown in FIG. 8C can be given by an equation:

$$L_{step}=(V_1-V_2)\times t_1,$$

where $V_1$ is the etching rate of the InP layer 16A or 16B in the process shown in FIG. 8C;

$V_2$ is the etching rate of the-etching rate adjusting layer 14A in the process shown in FIG. 8C; and $t_1$ is an etching time in the process shown in FIG. 8C.

It is noted that the stepped part $L_{step}$ should disappear as a result of the wet-etching process shown in FIG. 8D. Thus, the following relationship must hold, which can be shown by an expression:

$$L_{step}=(V_1-V_2)\times t_1=(V_4-V_3)\times t_2,$$

where, $V_3$ is the etching rate of the InP layer 16A or 16B in the wet-etching process shown in FIG. 8D;

$V_4$ is the etching rate of the etching rate adjusting layer 14A in the wet-etching process shown in FIG. 8D; and $t_2$ is an etching time in the process shown in FIG. 8D.

It is approximated from the relationship shown in FIG. 6 that the etching rate $V_3$ of the InP buried layer 16A, 16B in the process shown in FIG. 8D is approximately equal to the etching rate $V_1$, of the InP buried layer 16A, 16B in the process shown in FIG. 8C ($V_1 \approx V_3$). Then, the above-mentioned relationship can be rewritten, in a similar manner to the case shown in FIGS. 7C and 7D, as:

$$(V_1-V_2)\times t_1=(V_4-V_1)\times t_2.$$

To completely remove the etching rate adjusting layer 14A in the process shown in FIG. 8D, assuming that the relationship $V_1 \approx V_3$ holds, the thickness of the etching rate adjusting layer 14A may be selected at a value defined by an equation $V_1 \times (t_1+t_2)$.

C. Type III

Figure 9A:
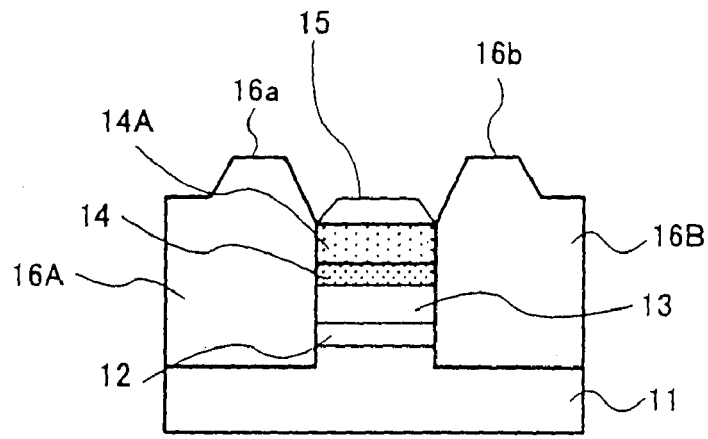
FIGS. 9A to 9C are diagrams showing various steps of a third basic type of the process of manufacturing the semiconductor device of the present invention.
Figure 9B:
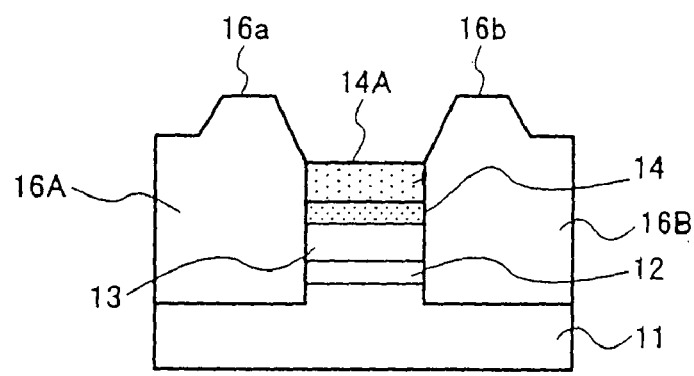
Figure 9C:
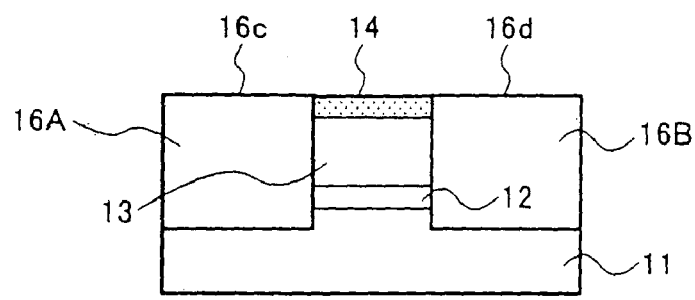

FIGS. 9A to 9C are diagrams showing a third type of the principle of the process of manufacturing the semiconductor device of the present invention for a case where the etching rate of planarizing the InP buried layers 16A and 16B is equal to the etching rate of the etching rate adjusting layer 14A. In FIGS. 9A to 9C, elements which have been described above are denoted by similar reference numerals and will not be described in detail.

Referring to FIGS. 9A to 9C, the processes of FIGS. 9A and 9B are the same as the processes shown in FIGS. 7A and 7B. That is to say, an InGaAs or InGaAsP etching rate adjusting layer 14A is formed on a p-type InGaAs contact layer 14, a mesa-stripe structure is formed on the InP substrate 11 using an insulating film pattern 15 as a mask, high-resistance InP buried layers 16A and 16B are formed on both sides of the mesa-stripe structure using the same insulating film pattern 15 as a selective-growth mask and the insulating film pattern 15 is removed.

In the process shown in FIG. 9C, a wet etching process is performed on the structure of FIG. 9B using an etchant containing hydrochloric acid, acetic acid and hydrogen peroxide solution and having a composition with the concentration of hydrogen peroxide solution being such that the etching rate of the InP buried layers 16A, 16B is approximately equal to the etching rate of the etching rate adjusting layer 14A. Thus, the stepped parts 16a and 16b of the InP buried layers 16A and 16B are etched and produce the planarized surfaces 16c and 16d. As a result of such wet-etching process, the etching rate adjusting layer 14A is etched at a rate that is substantially the same as that of the planarized surfaces 16c, 16d. Accordingly, a single wet-etching process produces a planar structure in which the planarized surfaces 16c, 16d and the surface of the etching rate adjusting layer 14A are substantially flush with each other.

For the processes shown in FIGS. 9A to 9C, when the etching rate adjusting layer 14A is of InGaAs, in accordance with the relationship shown in FIG. 6, the concentration of hydrogen peroxide solution Y may be selected at a value approximately equal to 0.2 (Y≈0.2) for the process shown in FIG. 9C. When the etching rate adjusting layer 14A is of InGaAsP layer which has a composition corresponding to a bandgap wavelength of a 1.3 μm, the concentration of hydrogen peroxide solution Y may be selected at a value approximately equal to 0.4 (Y≈0.4) for the process shown in FIG. 9C.

For the process of manufacturing the semiconductor device in accordance with Type III illustrated in FIGS. 9A to 9C, InP may be used as the etching rate adjusting layer 14A. When InP is used, in the wet-etching and planarizing process of FIG. 9C, there is no difference in the etching rates of the InP buried layer 16A, 16B and the etching rate adjusting layer 14A. Therefore, hydrogen peroxide solution contained in the etchant may be of any concentration.

D. Type IV

FIGS. 10A to 10D are diagrams showing a fourth type of the principle of the process of manufacturing the semiconductor device of the present invention in which, when planarizing the InP buried layers 16A and 16B, the selective-growth mask used for forming the InP buried layer by a regrowth process is not removed and used as an etching mask. In FIGS. 10A to 10D, elements which have been described above are denoted by similar reference numerals and will not be described in detail.

Figure 10A:
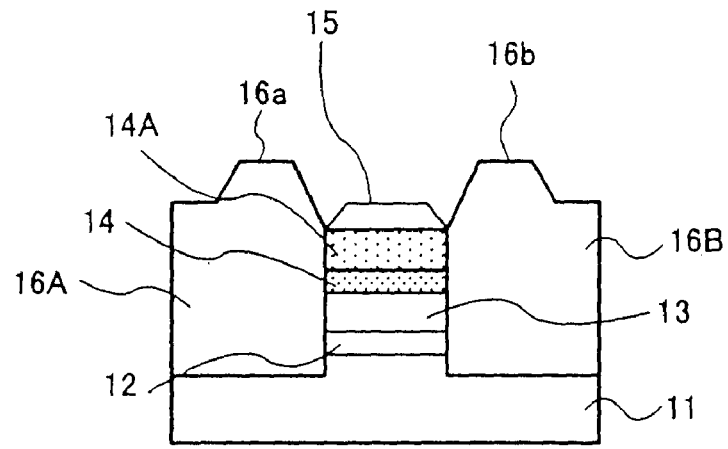
FIGS. 10A to 10D are diagrams showing various steps of a fourth basic type of the process of manufacturing the semiconductor device of the present invention.

Referring to FIGS. 10A to 10D, the process of FIG. 10A is the same as the process shown in FIG. 7A. That is to say, an InGaAs or InGaAsP etching rate adjusting layer 14A is formed on a p-type InGaAs contact layer 14, a mesa-stripe structure is formed on the InP substrate 11 using an insulating film pattern 15 as a mask, high-resistance InP buried layers 16A and 16B are formed on both sides of the mesa-stripe structure using the same insulating film pattern 15 as a selective-growth mask.

Figure 10B:
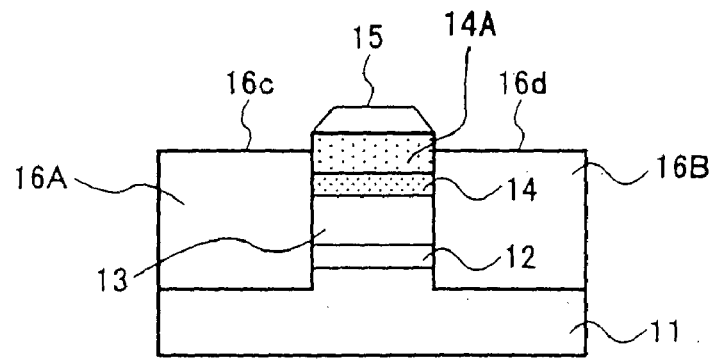

Then, in the process shown in FIG. 10B, with the insulating film pattern 15 being remained, a wet etching process is performed on the structure of FIG. 10A using an etchant containing hydrochloric acid, acetic acid and hydrogen peroxide solution. Thus, the stepped parts 16a and 16b of the InP buried layers 16A and 16B are etched and produce the planarized surfaces 16c and 16d. As a result of such wet-etching process, since the mesa-structure is protected by the insulating film pattern 15, the etching rate adjusting layer 14A protrudes upwardly from the planarized surfaces 16c and 16d and thus forms a protruded structure.

Figure 10C:
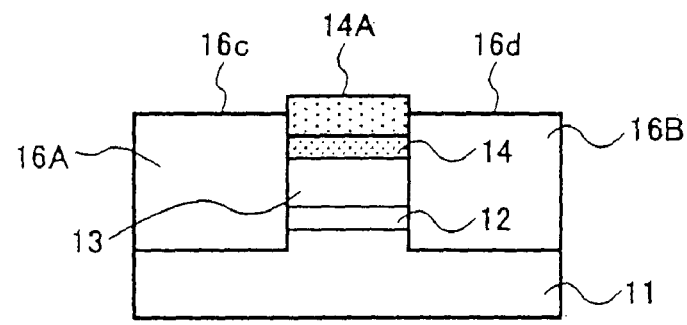

Then, in the process shown in FIG. 10C, the insulating film pattern 15 is removed. Further, in the process shown in FIG. 10D, the etching rate adjusting layer 14A and the InP planarized surfaces 16c and 16d are etched using an etchant containing hydrochloric acid, acetic acid and hydrogen peroxide solution and has a composition with concentration of hydrogen peroxide solution being selected such that the etching rate of the etching rate adjusting layer is greater than the etching rate of InP.

For the processes shown in FIG. 10B, when the etching rate adjusting layer 14A is of InGaAs, the concentration of hydrogen peroxide solution Y may be selected as any value on a graph of FIG. 5 within a range where surface orientation selectivity is obtained. However, for the process shown in FIG. 10D, the concentration of hydrogen peroxide solution Y is preferably selected at a value greater than 0.2 (Y>0.2) such that the etching rate adjusting layer 14A will be etched at a greater rate. When the etching rate adjusting layer 14A is of InGaAsP layer which has a composition corresponding to a bandgap wavelength of a 1.3 μm, for the process shown in FIG. 10B, the concentration of hydrogen peroxide solution Y may be similarly selected as any value within a range where surface orientation selectivity is obtained. However, for the process shown in FIG. 10D, the concentration of hydrogen peroxide solution Y is preferably selected at a value greater than 0.4 (Y>0.4) such that the InGaAsP etching rate adjusting layer 14A will be etched at a greater rate.

Figure 10D:
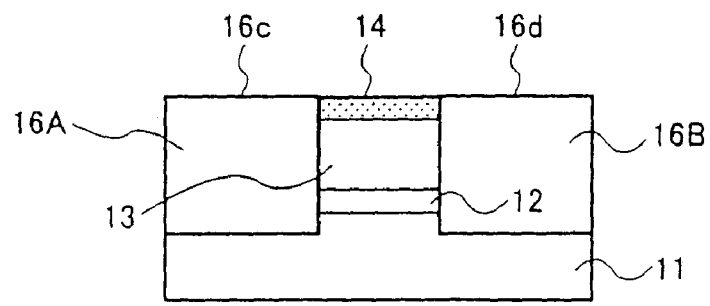

Also, in the process shown in FIG. 10D, in order to achieve a structure in which the surface of the contact layer 14 is flush with the planarized surfaces 16c and 16d of the InP buried layers 16A and 16B, the durations of the wet-etching processes of FIGS. 10B and 10D must be appropriately selected based on the etching rates of the etchants used in the respective wet-etching processes.

In detail, a stepped part $L_{step}$ formed between the surface of the etching rate adjusting layer 14A and the planarized surface 16c or 16d in the step shown in FIG. 10B can be given by an equation:

$$L_{step} = V_1 \times t_1,$$

where $V_1$ is the etching rate of the InP layer 16A or 16B in the process shown in FIG. 10B; and $t_1$ is an etching time in the process shown in FIG. 10B.

It is noted that the stepped part $L_{step}$ should disappear as a result of the wet-etching process shown in FIG. 10D. Thus, the following relationship must hold, which can be shown by an expression:

$$L_{step} = V_1 \times t_1 = (V_4 - V_3) \times t_2,$$

where, $V_3$ is the etching rate of the InP layer 16A or 16B in the wet-etching process shown in FIG. 10D;

$V_4$ is the etching rate of the etching rate adjusting layer 14A in the wet-etching process shown in FIG. 10D; and $t_2$ is an etching time in the process shown in FIG. 10D.

Now, it is approximated from the relationship shown in FIG. 6 that the etching rate $V_3$ of the InP buried layer 16A, 16B in the process shown in FIG. 10D is approximately equal to the etching rate $V_1$ of the InP buried layer 16A, 16B in the process shown in FIG. 10B ($V_1 \approx V_3$). Then, the above-mentioned relationship can be rewritten as:

$$V_1 \times t_1 = (V_4 - V_1) \times t_2.$$

To completely remove the etching rate adjusting layer 14A in the process shown in FIG. 10D, assuming that the relationship $V_1 \approx V_3$ holds, the thickness of the etching rate adjusting layer 14A may be selected at a value defined by an equation $V_1 \times (t_1+t_2)$.

For the above-described types I to IV, InGaAs or InGaAsP or InP is used as the etching rate adjusting layer 14A. However, the material of the etching rate adjusting layer 14A is not limited to such material, but may also be any one of InGaAs, InAs, InGaP, InGaAsP and GaInNAs. In order to vary the selectivity of etching between the wet-etching process and the planarizing process, the concentration of acetic acid X in the etchant may be altered. Particularly when the etching rate adjusting layer 14A is of InGaAsP with the composition having a bandgap within a range between 1.3 µm and 1.65 µm, a value between the etching rate of InGaAsP and the etching rate of InGaAs for the 1.3 µm composition is obtained in accordance with the relationship shown in FIG. 6.

In the principle described above, the stepped part between the embedded InP layer 16A, 16B and the contact layer 14 are substantially eliminated by performing one or two wet-etching and planarizing process/processes. However, the present invention not only includes a case where the stepped part is completely eliminated but also a case where the stepped part has been reduced compared to the original state as a result of the planarizing process.

Also, regarding the process of planarizing the original stepped parts 16a and 16b on the InP buried layers 16A and 16B based on the relationships illustrated in FIGS. 3 to 5, such as the process shown in FIG. 7C, the present invention includes not only a case where the planarized surfaces 16c and 16d obtained as a result of wet-etching is flush with the (100), (011) and (0-1-1) surface but also a case where a surface having an index closer to those crystal surfaces is obtained.

Referring now to FIGS. 11A to 12G, a process of manufacturing a laser diode having a BH structure of a first embodiment of the present invention will be described.

Figure 11A:
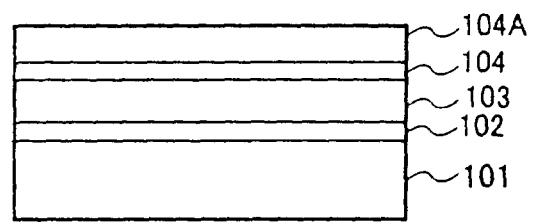
FIGS. 11A to 11C are diagrams showing various steps of a manufacturing process of a first embodiment of the present invention.

As shown in FIG. 11A, on an n-type InP substrate 101, an InGaAsP/InGaAsP multi-quantum well active layer 102, a p-type InP cladding layer 103, and a p-type InGaAs contact layer 104 are successively stacked and then an etching rate adjusting layer 104A of InGaAsP having a composition giving a bandgap wavelength of 1.3 µm is stacked with a thickness of about 0.4 µm.

Figure 11B:
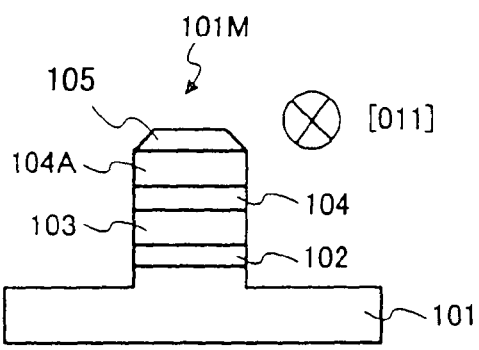

Then, in a process shown in FIG. 11B, dry-etching is performed using the $SiO_2$ film 105 as an etching mask so as to form an active layer mesa-stripe 101M. In the illustrated example, the active layer mesa-stripe 101M extend in the <011> direction.

Figure 11C:
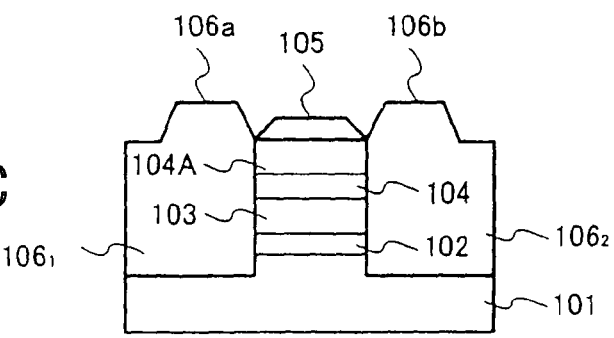

Then, in a process shown in FIG. 11C, a MOVPE method is implemented using the $SiO_2$ film 105 as a selective growth mask. Thus, Fe-doped InP buried layers $106_1$, $106_2$ are formed on the substrate 101 on both sides of the mesa-stripe 101M. The above-described MOVPE method is performed under a condition of, for example, a growth temperature of 630° C. and a growth pressure of 0.1 atmosphere. TMIn, $PH_3$ and $Cp_2Fe$ are used as materials of ii group element, V group element and Fe-dopants, respectively.

In the present embodiment, the thickness of the InP buried layer $106_1$, $106_2$ are chosen such that the lowermost part of the InP buried layer $106_1$, $106_2$ is at a level higher than the InGaAsP etching rate adjusting layer 104A in the mesa-stripe 101M. As a result of the process shown in FIG. 11C, raised parts 106a, 106b are formed on the InP buried layer $106_1$, $106_2$, respectively, at positions adjacent the $SiO_2$ film 105 on the mesa-stripe 101M.

Figure 12D:
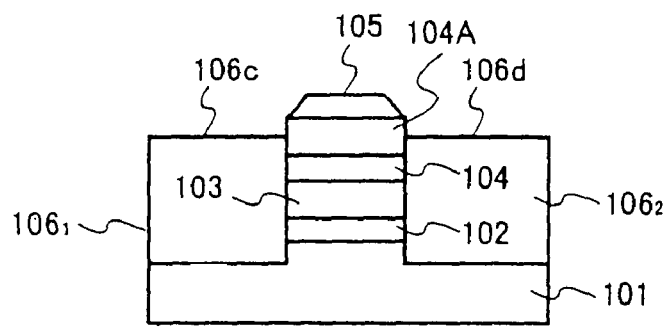
FIGS. 12D to 12G are diagrams showing various steps following the steps shown in FIG. 11C.

In a process shown in FIG. 12D, the structure shown in FIG. 11C is wet-etched using a first etchant which is a mixture of hydrochloric acid, acetic acid, hydrogen peroxide solution and water.

In the process shown in FIG. 12D, the composition ratio of hydrochloric acid, acetic acid, hydrogen peroxide solution and water in the above-mentioned etchant is selected as 1:1:0.1:1. The etching process is performed with a temperature of the mixture at 23° C. and typically for 1 minute. As a result of such an etching process, as shown in FIG. 12D, the surfaces 106a, 106b of the InP buried layers $106_1$, $106_2$ changes to the (100) surfaces or planarized surfaces 106c, 106d near the (100) surfaces. The planarized surfaces 106c, 106d form stepped parts having a height of about 0.12 µm with respect to the surface of the InGaAsP layer 104A protected by the $SiO_2$ film 105.

Figure 12E:
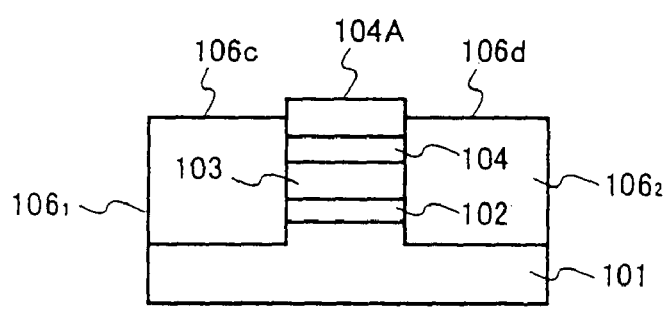

Then, in a process shown in FIG. 12E, the $SiO_2$ film 105 is removed by an HF treatment. Then in a process shown in FIG. 12F, the structure shown in FIG. 12E is wet-etched using a second etchant which is a mixture of hydrochloric acid, acetic acid, hydrogen peroxide solution and water until the p-type InGaAs contact layer 104 underlying the InGaAsP layer 104A is exposed.

Figure 12F:
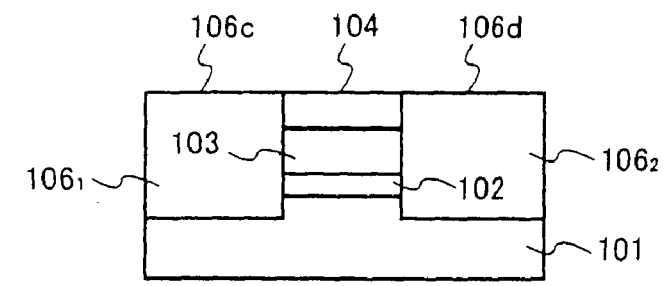

In the wet-etching process shown in FIG. 12F, the composition ratio of hydrochloric acid, acetic acid, hydrogen peroxide solution and water is selected as 1:1:0.6:1. The etching process is performed with a temperature of the mixture at 23° C. and typically for 2 minutes. In the wet-etching process using the second etchant, the etching rate of the InGaAsP layer 14A becomes greater than the etching rate of the InP buried layers $106_1$, $106_2$. As a result, the stepped part on the surface produced in the process shown in FIG. 12E disappears. Accordingly, as shown in FIG. 12F, the InP buried layers $106_1$, $106_2$ and the contact layer 104 become flush.

Figure 12G:
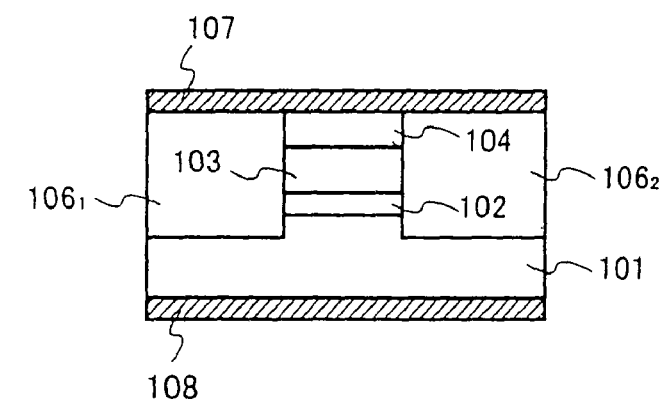

Finally, a process shown in FIG. 12G, a p-side electrode 107 is formed on the p-type InGaAs layer 104 and an n-side electrode 108 is formed on a lower surface of the substrate 101.

Figure 2:
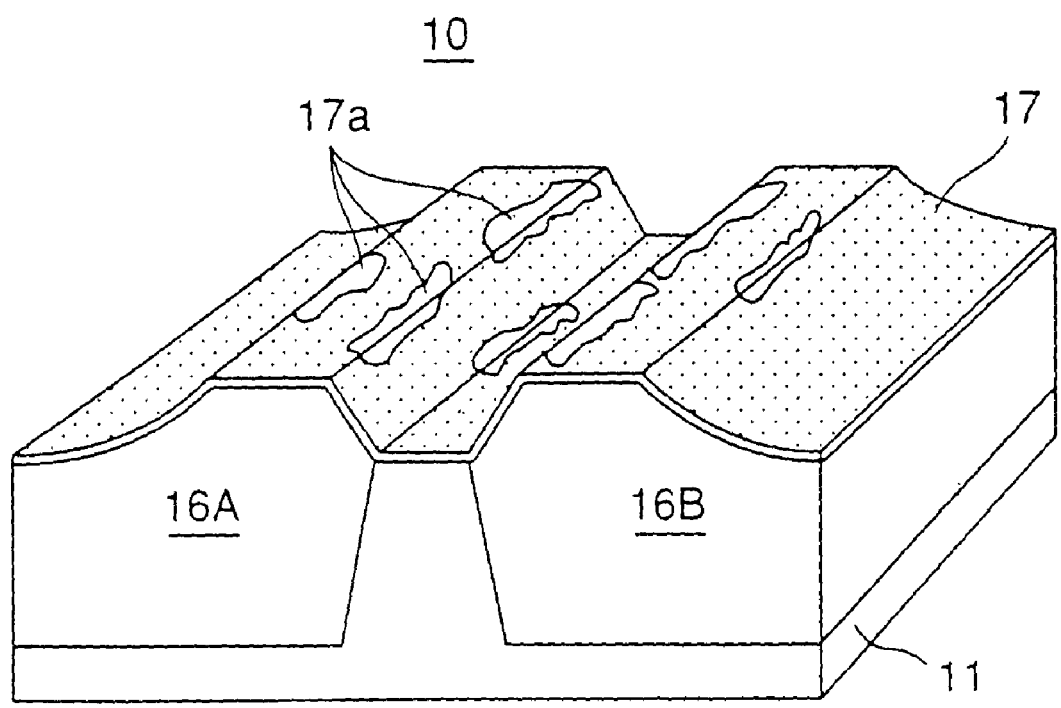
FIG. 2 is a diagram showing a problematic aspect of the process of FIG. 1.

In the present embodiment, the InP buried layers $106_1$, $106_2$ is flush with the contact layer 104. Therefore, the p-side electrode 107 is stacked on a flat surface and thus the break of the electrode illustrated in FIG. 2 will not occur.

Referring now to FIGS. 13A to 14F, a process of manufacturing a laser diode having a BH structure of a second embodiment of the present invention will be described. In FIGS. 13A to 14F, elements which have been described above are denoted by similar reference numerals and will not be described in detail.

Figure 13A:
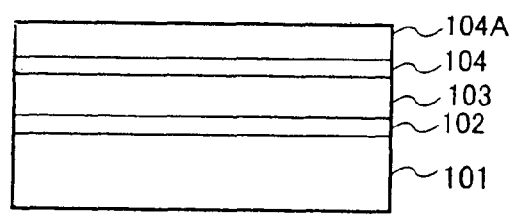
FIGS. 13A to 13C are diagrams showing various steps of a manufacturing process of a second embodiment of the present invention.
Figure 13B:
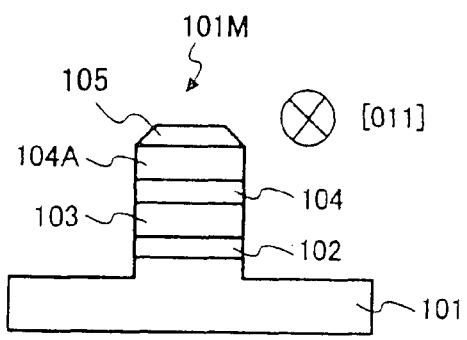
Figure 13C:
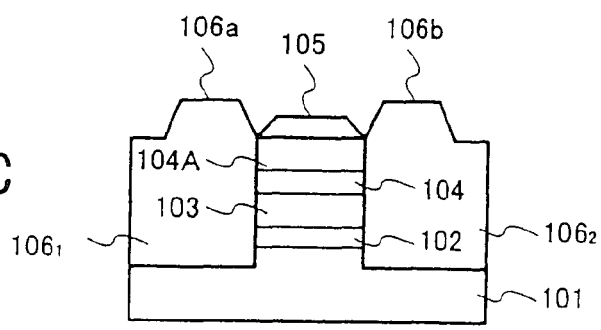

Referring to FIGS. 13A to 14F, processes shown in FIGS. 13A to 13C are substantially the same as the processes shown in FIGS. 11A to 11C. That is to say, InP buried layers $106_1$, and $106_2$ are formed by a regrowth process using the $SiO_2$ film 105 as a selective growth mask on both sides of the mesa-structure 101M covered by $SiO_2$ film 105. During the regrowth process, the stepped parts 106a and 106b are formed on the InP buried layers $106_1$ and $106_2$, respectively. In the processes shown in FIGS. 13A to 13C, the InGaAsP layer 104A having a composition giving a bandgap wavelength of 1.3 µm are formed with a thickness of about 0.52 µm.

Figure 14D:
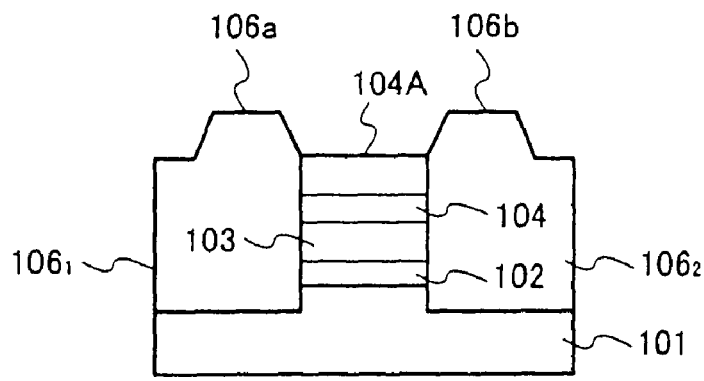
FIGS. 14D to 14F are diagrams showing various steps following the steps shown in FIG. 13C.

Then in the process of FIG. 14D, the $SiO_2$ film 105 is removed by an HF treatment. Then in a process shown in FIG. 14E, the structure shown in FIG. 14D is wet-etched using a first etchant which is a mixture of hydrochloric acid, acetic acid, hydrogen peroxide solution and water.

Figure 14E:
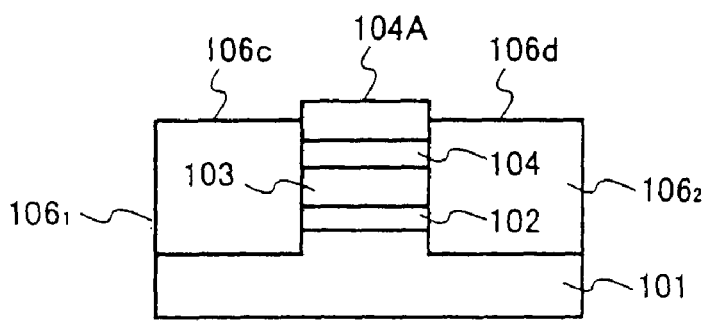

In the process shown in FIG. 14E, the composition ratio of hydrochloric acid, acetic acid, hydrogen peroxide solution and water in the above-mentioned etchant is selected as 1:1:

0.1:1. The etching process is performed with a temperature of the mixture at 23° C. and typically for 1 minute. When the first etchant is used, the etching rate of the InP buried layer $106_1$ and $106_2$ is greater than the etching rate of the InGaAsP etching rate adjusting layer 104A. As a result of such an etching process, as shown in FIG. 14E, the surfaces 106a, 106b of the InP buried layers $106_1$, $106_2$ changes to the (100) surfaces or planarized surfaces 106c, 106d near the (100) surfaces. Thus-formed planarized surfaces 106c, 106d form steps having a height of about 0.12 μm with respect to the surface of the InGaAsP layer 104A. Thus, a protruded structure having a height 0.12 μm is formed on the structure shown in FIG. 14E.

Figure 14F:
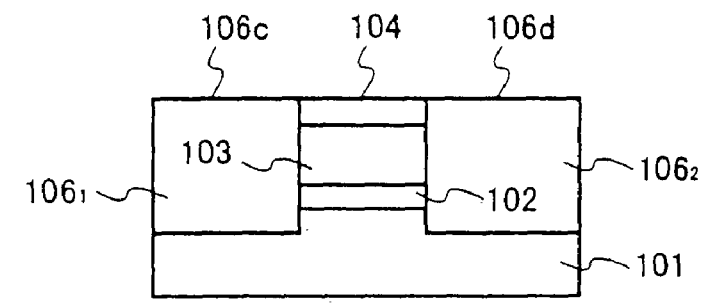

Then, in a process shown in FIG. 14F, the structure shown in FIG. 14E is wet-etched using a second etchant which is a mixture of hydrochloric acid, acetic acid, hydrogen peroxide solution and water until the p-type InGaAs contact layer 104 underlying the InGaAsP layer 104A is exposed.

In the wet-etching process shown in FIG. 14F, the composition ratio of hydrochloric acid, acetic acid, hydrogen peroxide solution and water is selected as 1:1:0.6:1. The etching process is performed with a temperature of the mixture at 23° C. and typically for 2 minutes. In the wet-etching process using the second etchant, the etching rate of the InGaAsP etching rate adjusting layer 14A becomes greater than the etching rate of the InP buried layers $106_1$, $106_2$. As a result, the stepped part of the surface produced in the process shown in FIG. 14E disappears. Accordingly, as shown in FIG. 14F, the InP buried layers $106_1$, $106_2$ and the contact layer 104 become flush.

Finally, although not shown in the figures, in a manner similar to a process shown in FIG. 12G, a p-side electrode 107 is formed on the p-type InGaAs layer 104 and an n-side electrode 108 is formed on a lower surface of the substrate 101.

In the present embodiment, the embedded layers $106_1$, $106_2$ form a planarized surface with the contact layer 104. Therefore, the p-side electrode 107 is stacked on a flat surface and thus the break of the electrode illustrated in FIG. 2 will not occur.

Referring now to FIGS. 15A to 16F, a process of manufacturing a laser diode having a BH structure of a third embodiment of the present invention will be described. In FIGS. 15A to 16F, elements which have been described above are denoted by similar reference numerals and will not be described in detail.

Figure 15A:
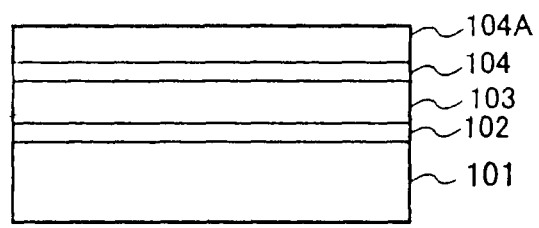
FIGS. 15A to 15C are diagrams showing various steps of a manufacturing process of a third embodiment of the present invention.
Figure 15B:
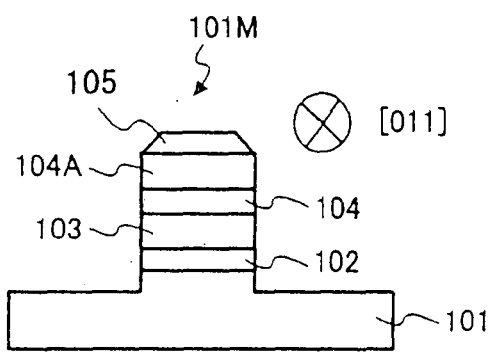
Figure 15C:
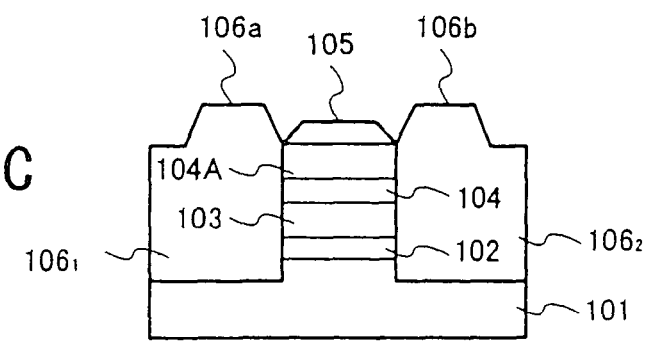

Referring to FIGS. 15A to 16F, processes shown in FIGS. 15A to 15C are substantially the same as the processes shown in FIGS. 13A to 13C. That is to say, InP buried layers $106_1$ and $106_2$ are formed by a regrowth process using the SiO$_2$ film 105 as a selective growth mask on both sides of the mesa-structure 101M covered by SiO$_2$ film 105. During the regrowth process, the stepped parts 106a and 106b are formed on the InP buried layers $106_1$ and $106_2$, respectively. In the processes shown in FIGS. 15A to 15C, the InGaAs layer 104A are formed with a thickness of about 0.52 μm.

Figure 16D:
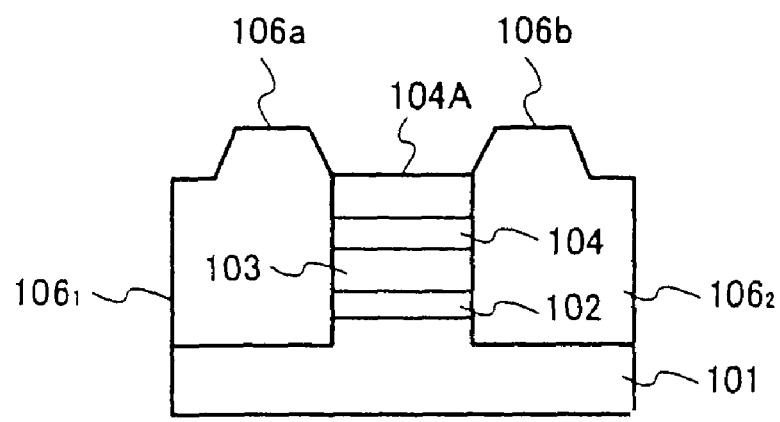
FIGS. 16D to 16F are diagrams showing various steps following the steps shown in FIG. 15C.

Then in the process of FIG. 16D, the SiO$_2$ film 105 is removed by an HF treatment. Then in a process shown in FIG. 16E, the structure shown in FIG. 16D is wet-etched using a first etchant which is a mixture of hydrochloric acid, acetic acid, hydrogen peroxide solution and water.

Figure 16E:
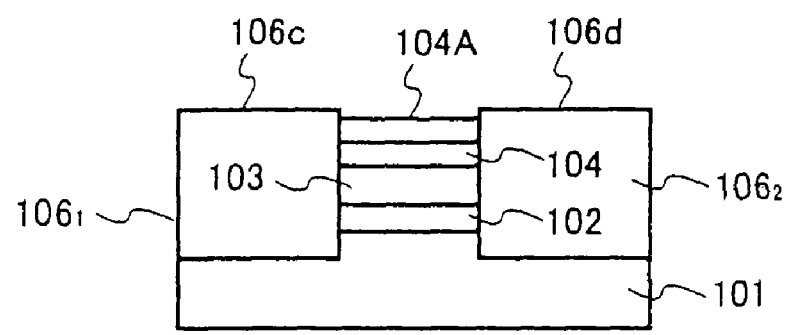

In the process shown in FIG. 16E, the composition ratio of hydrochloric acid, acetic acid, hydrogen peroxide solution and water in the above-mentioned etchant is selected as 1:1: 0.3:1. The etching process is performed with a temperature of the mixture at 23° C. and typically for 1 minute. When the first etchant is used, the etching rate of the InP buried layer $106_1$ and $106_2$ is smaller than the etching rate of the InGaAs etching rate adjusting layer 104A. As a result of such an etching process, as shown in FIG. 16E, the surfaces 106a, 106b of the InP buried layers $106_1$, $106_2$ changes to the (100) surfaces or planarized surfaces 106c, 106d near the (100) surfaces. Thus-formed planarized surfaces 106c, 106d form stepped parts having a height of about 0.12 μm with respect to the surface of the InGaAs layer 104A. Thus, a recessed structure having a depth 0.12 μm is formed on the structure shown in FIG. 16E.

Figure 16F:
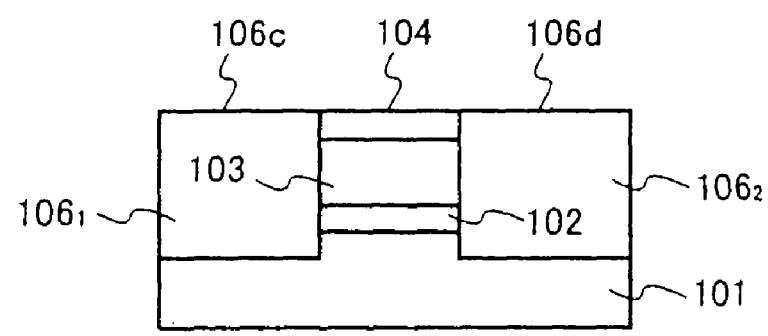
Figure 17A:
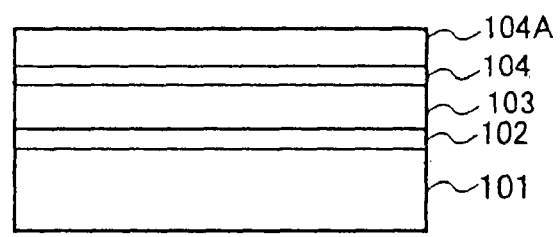
FIGS. 17A to 17C are diagrams showing various steps of a manufacturing process of a fourth embodiment of the present invention.
Figure 17B:
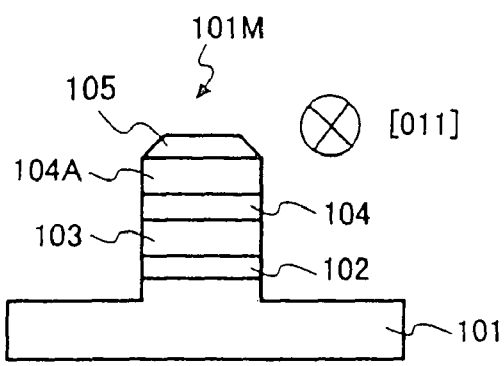
Figure 17C:
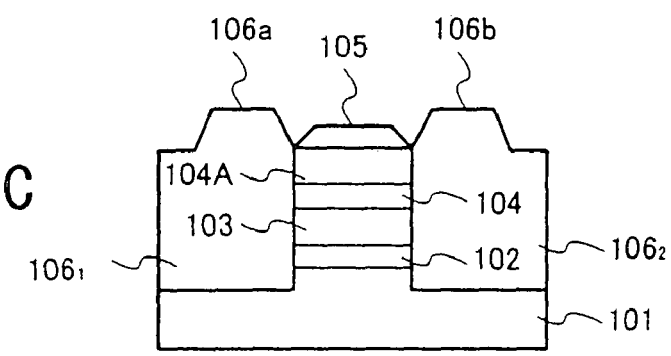

Then, in a process shown in FIG. 16F, the structure shown in FIG. 16E is wet-etched using a second etchant which is a mixture of hydrochloric acid, acetic acid, hydrogen peroxide solution and water until the p-type InGaAs contact layer 104 underlying the InGaAs layer 104A is exposed.

In the wet-etching process shown in FIG. 16F, for the second etchant, the composition ratio of hydrochloric acid, acetic acid, hydrogen peroxide solution and water is selected as 1:1:0.1:1. The etching process is performed with a temperature of the mixture at 23° C. and typically for 2 minutes. In the wet-etching process using the second etchant, the etching rate of the InGaAs etching rate adjusting layer 14A becomes smaller than the etching rate of the InP buried layers $106_1$, $106_2$. As a result, the stepped parts of the surface produced in the process shown in FIG. 16E disappears. Accordingly, as shown in FIG. 16F, the InP buried layers $106_1$, $106_2$. and the contact layer 104 become flush.

Finally, although not shown in the figures, in a manner similar to a process shown in FIG. 12G, a p-side electrode 107 is formed on the p-type InGaAs layer 104 and an n-side electrode 108 is formed on a lower surface of the substrate 101.

In the present embodiment, the embedded layers $106_1$, $106_2$ form a planarized surface with the contact layer 104 in the step shown in FIG. 16F. Therefore, the p-side electrode 107 is stacked on a flat surface and thus the break of the electrode illustrated in FIG. 2 will not occur.

Referring now to FIGS. 17A to 18E, a process of manufacturing a laser diode having a BH structure of a fourth embodiment of the present invention will be described. In FIGS. 17A to 18E, elements which have been described above are denoted by similar reference numerals and will not be described in detail.

Referring to FIGS. 17A to 18E, processes shown in FIGS. 17A to 18E are substantially the same as the processes shown in FIGS. 13A to 13C. That is to say, InP buried layers $106_1$ and $106_2$ are formed by a regrowth process using the SiO$_2$ film 105 as a selective growth mask on both sides of the mesa-structure 101M covered by SiO$_2$ film 105. During the regrowth process, the stepped parts 106a and 106b are formed on the InP buried layers $106_1$ and $106_2$, respectively. In the processes shown in FIGS. 17A to 17C, the InGaAs layer 104A are formed with a thickness of about 0.28 μm.

Figure 18D:
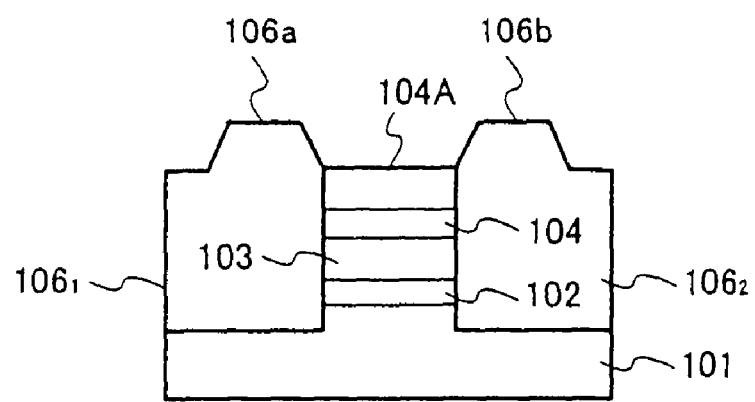
FIGS. 18D to 18E are diagrams showing various steps following the steps shown in FIG. 17C.

Then in the process of FIG. 18D, the SiO$_2$ film 105 is removed by an HF treatment. Then in a process shown in FIG. 18E, the structure shown in FIG. 18D is wet-etched using an etchant which is a mixture of hydrochloric acid, acetic acid, hydrogen peroxide solution and water.

Figure 18E:
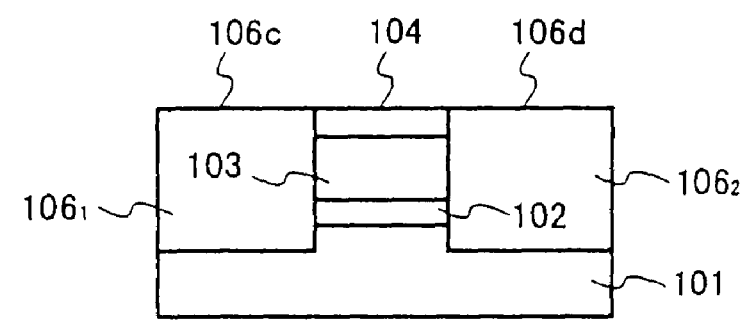
Figure 19A:
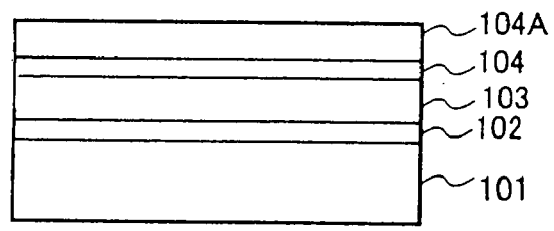
FIGS. 19A to 19C are diagrams showing various steps of a manufacturing process of a fifth embodiment of the present invention.
Figure 19B:
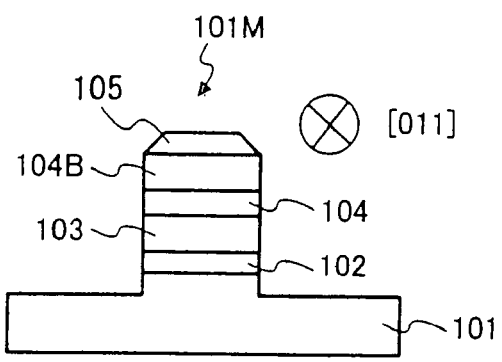
Figure 19C:
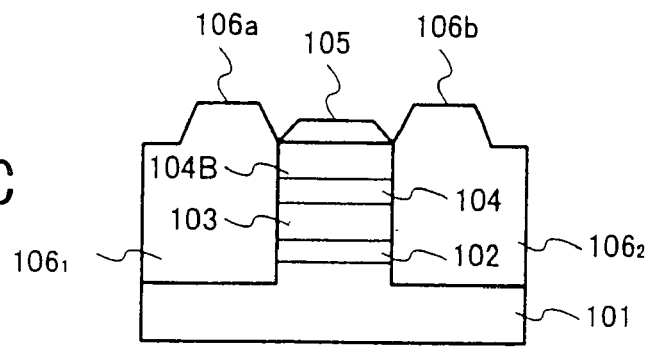

In the process shown in FIG. 18E, the composition ratio of hydrochloric acid, acetic acid, hydrogen peroxide solution and water in the above-mentioned etchant is selected as 1:1: 0.2:1. The etching process is performed with a temperature of the mixture at 23° C. and typically for 2 minutes. When the above-mentioned etchant is used, substantially the same etching rate is obtained for the InP buried layers $106_1$ and $106_2$ and for the InGaAs etching rate adjusting layer 104A. As a result of such an etching process, as shown in FIG. 18E, the surfaces 106a, 106b of the InP buried layers $106_1$, $106_2$ changes to the (100) surfaces or planarized surfaces 106c, 106d near the (100) surfaces and the planarized surfaces 106c an 106d form planarized surfaces which are substantially flush with the surface of the InGaAs contact layer 104.

Finally, although not shown in the figures, in a manner similar to a process shown in FIG. 12G, a p-side electrode 107 is formed on the p-type InGaAs layer 104 and an n-side electrode 108 is formed on a lower surface of the substrate 101.

In the present embodiment, the embedded layers $106_1$, $106_2$ form a planarized surface with the contact layer 104 in the step shown in FIG. 18E. Therefore, the p-side electrode 107 is stacked on a flat surface and thus the break of the electrode illustrated in FIG. 2 will not occur.

Referring now to FIGS. 19A to 20E, a process of manufacturing a laser diode having a BH structure of a third embodiment of the present invention will be described. In FIGS. 19A to 20E, elements which have been described above are denoted by similar reference numerals and will not be described in detail.

Referring to FIGS. 19A to 20E, processes shown in FIGS. 19A to 20E are substantially the same as the processes shown in FIGS. 13A to 13C. That is to say, InP buried layers $106_1$ and $106_2$ are formed by a regrowth process using the $SiO_2$ film 105 as a selective growth mask on both sides of the mesa-structure 101M covered by $SiO_2$ film 105. During the regrowth process, the stepped parts 106a and 106b are formed on the InP buried layers $106_1$ and $106_2$, respectively. In the processes shown in FIGS. 19A to 19C, instead of the InGaAs layer 104A used in the processes of FIGS. 13A to 13C, the InP layer 104B is formed on the contact layer 104 with a thickness of about 0.2 μm.

Figure 20D:
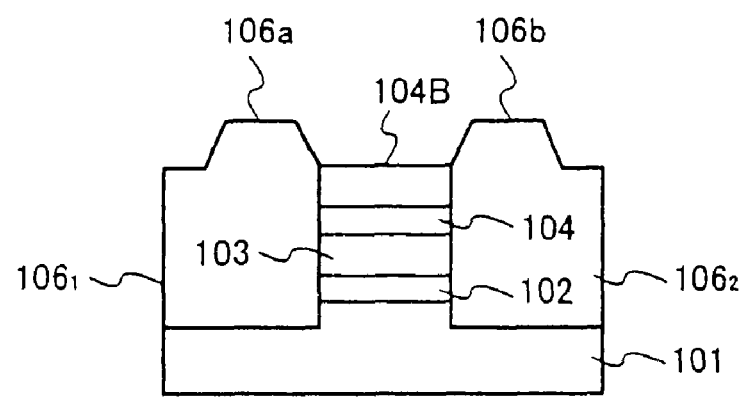
FIGS. 20D to 20E are diagrams showing various steps following the steps shown in FIG. 19C.

Then in the process of FIG. 20D, the $SiO_2$ film 105 is removed by an HF treatment. Then in a process shown in FIG. 20E, the structure shown in FIG. 20D is wet-etched using an etchant which is a mixture of hydrochloric acid, acetic acid and water.

Figure 20E:
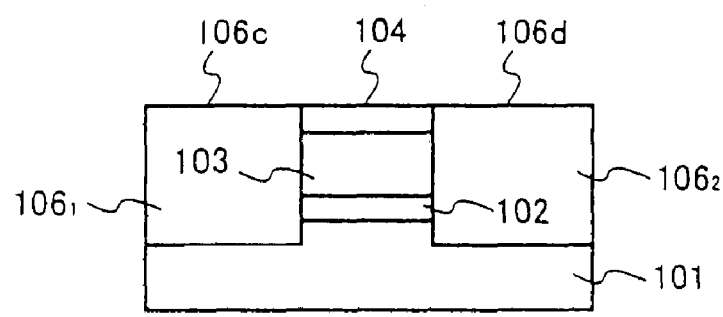

In the process shown in FIG. 20E, the composition ratio of hydrochloric acid, acetic acid and water in the above-mentioned etchant is selected as 1:5:1. The etching process is performed with a temperature of the mixture at 23° C. and typically for 2 minutes. As a result of such an etching process, as shown in FIG. 20E, the surfaces 106a, 106b of the InP buried layers 106A, 106B changes to the (100) surfaces or planarized surfaces 106c, 106d near the (100) surfaces and the planarized surfaces 106c an 106d form planarized surfaces which are substantially flush with the surface of the InGaAs contact layer 104.

Finally, although not shown in the figures, in a manner similar to a process shown in FIG. 12G, a p-side electrode 107 is formed on the p-type InGaAs layer 104 and an n-side electrode 108 is formed on a lower surface of the substrate 101.

In the present embodiment, the embedded layers $106_1$, $106_2$ form a planarized surface with the contact layer 104 in the step shown in FIG. 20E. Therefore, the p-side electrode 107 is stacked on a flat surface and thus the break of the electrode illustrated in FIG. 2 will not occur.

Further, the present invention is not limited to these embodiments, and variations and modifications may be made without departing from the scope of the present invention.

The present application is based on Japanese priority application No. 2001-039252 filed on Feb. 15, 2001, the entire contents of which are hereby incorporated by reference.

What is claimed is:

1. A process of manufacturing a semiconductor device, comprising the steps of:

a) forming a stacked structure of a first III-V compound semiconductor layer containing In and having a composition different from InP and a second III-V compound semiconductor layer containing In, said second III-V compound semiconductor layer being formed directly on said first III-V compound semiconductor layer, where said second III-V compound semiconductor layer is disposed above said first III-V compound semiconductor layer;

b) growing an InP layer at regions adjacent said stacked structure to form a stepped structure of InP, said stepped structure and said stacked structure together forming a composite structure;

c) wet-etching said composite structure using an etchant containing hydrochloric acid and acetic acid, to produce an etched structure, wherein said etchant has a composition tailored such that, in said step c), an etching rate of said stepped structure is greater than an etching rate of said second III-V compound semiconductor layer of said composite structure; and d) second wet-etching said etched structure using a second etchant containing hydrochloric acid and acetic acid to obtain a planarized structure, said second etchant having a composition tailored such that an etching rate of said stepped structure is smaller than an etching rate of said second III-V compound semiconductor layer, of said etched structure, wherein the relationship between an etching time $T_1$ in said step c) and an etching time $T_2$ in said step d) is determined in accordance with an equation:

$$(V_1-V_2) \times T_1 = (V_4-V_3) \times T_2,$$

where $V_1$ is an etching rate of the InP layer in said step c);
$V_2$ is an etching rate of said second III-V compound semiconductor layer in said step c);
$V_3$ is an etching rate of the InP layer in said step d); and
$V_4$ is an etching rate of said second III-V compound semiconductor layer in said step d).

2. A process of manufacturing a semiconductor device, comprising the steps of:

a) forming a stacked structure of a first III-V compound semiconductor layer containing In and having a composition different from InP and a second III-V compound semiconductor layer containing In, said second III-V compound semiconductor layer being formed directly on said first III-V compound semiconductor layer, where said second III-V compound semiconductor layer is disposed above said first III-V compound semiconductor layer, and forming a pattern covering said second III-V compound semiconductor layer on said stacked structure, wherein said second III-V compound semiconductor layer is protected by said pattern upon wet-etching said composite structure;

b) growing an InP layer at regions adjacent said stacked structure to form a stepped structure of InP, said stepped structure and said stacked structure together forming a composite structure;

c) wet-etching said composite structure using an etchant containing hydrochloric acid and acetic acid, to produce an etched structure;

d) removing said pattern after said wet-etching; and e) second wet-etching said etched structure using a second etchant containing hydrochloric acid and acetic acid to obtain a planarized structure, said second etchant having a composition tailored such that an etching rate of said stepped structure is smaller than an etching rate of said second III-V compound semiconductor layer, of said etched structure, wherein said second etchant further contains at least one of water and hydrogen peroxide solution.

3. The process as claimed in claim 2, wherein the relationship between an etching time $T_1$ in said step c) and an etching time $T_2$ in said step e) is determined in accordance with an equation:

$$V_1 \times T_1 = (V_4 - V_3) \times T_2,$$

where $V_1$ is an etching rate of the InP layer in said step c); $V_3$ is an etching rate of the InP layer in said step e); and $V_4$ is an etching rate of said second III-V compound semiconductor layer in said step e).

4. The process of manufacturing a semiconductor device, comprising the steps of:
   a) forming a stacked structure of a first III-V compound semiconductor layer containing In and having a composition different from InP and a second III-V compound semiconductor layer containing In, said second III-V compound semiconductor layer being formed directly on said first III-V compound semiconductor layer, where said second III-V compound semiconductor layer is disposed above said first III-V compound semiconductor layer, and forming a pattern covering said second III-V compound semiconductor layer on said stacked structure, wherein said second III-V compound semiconductor layer is protected by said pattern upon wet-etching said composite structure;
   b) growing an InP layer at regions adjacent said stacked structure to form a stepped structure of InP, said stepped structure and said stacked structure together forming a composite structure; and
   c) wet-etching said composite structure using an etchant containing hydrochloric acid and acetic acid, to produce an etched structure.

5. A process of manufacturing a semiconductor device, comprising the steps of:
   a) forming a stacked structure of a first III-V compound semiconductor layer containing In and having a composition different from InP and a second III-V compound semiconductor layer containing In, said second III-V compound semiconductor layer being formed directly on said first III-V compound semiconductor layer, where said second III-V compound semiconductor layer is disposed above said first III-V compound semiconductor layer;
   b) growing an InP layer at regions adjacent said stacked structure to form a stepped structure of InP, said stepped structure and said stacked structure together forming a composite structure;
   c) wet-etching said composite structure using an etchant containing hydrochloric acid and acetic acid, to produce an etched structure, wherein said etchant has a composition tailored such that, in said step c), an etching rate of said stepped structure is greater than an etching rate of said second III-V compound semiconductor layer of said composite structure; and
   d) second wet-etching said etched structure using a second etchant containing hydrochloric acid and acetic acid to obtain a planarized structure, said second etchant having a composition tailored such that an etching rate of said stepped structure is smaller than an etching rate of said second III-V compound semiconductor layer, of said etched structure.

6. A process of manufacturing a semiconductor device, comprising the steps of:
   a) forming a stacked structure of a first III-V compound semiconductor layer containing In and having a composition different from InP and a second III-V compound semiconductor layer containing In, said second III-V compound semiconductor layer being formed directly on said first III-V compound semiconductor layer, where said second III-V compound semiconductor layer is disposed above said first III-V compound semiconductor layer, and forming a pattern covering said second III-V compound semiconductor layer on said stacked structure, wherein said second III-V compound semiconductor layer is protected by said pattern upon wet-etching said composite structure;
   b) growing an InP layer at regions adjacent said stacked structure to form a stepped structure of InP, said stepped structure and said stacked structure together forming a composite structure;
   c) wet-etching said composite structure using an etchant containing hydrochloric acid and acetic acid, to produce an etched structure;
   d) removing said pattern after said wet-etching; and
   e) second wet-etching said etched composite using a second etchant containing hydrochloric acid and acetic acid to produce a planarized structure, said second etchant having a composition tailored such that an etching rate of said stepped structure is smaller than an etching rate of said second III-V compound semiconductor layer, of said etched structure.

* * * * *